(12) United States Patent
Giust

(10) Patent No.: US 8,473,233 B1
(45) Date of Patent: Jun. 25, 2013

(54) ANALYZING JITTER IN A CLOCK TIMING SIGNAL

(76) Inventor: Gary K. Giust, Santa Clara, CA (US)

( * ) Notice: Subject to any disclaimer, the term of this patent is extended or adjusted under 35 U.S.C. 154(b) by 392 days.

(21) Appl. No.: 12/781,959

(22) Filed: May 18, 2010

Related U.S. Application Data

(60) Provisional application No. 61/231,318, filed on Aug. 5, 2009.

(51) Int. Cl.
*G01R 29/18* (2006.01)

(52) U.S. Cl.
USPC ............... 702/69; 702/66; 702/79; 702/89; 702/194

(58) Field of Classification Search
USPC ............ 702/57, 66, 69, 70, 79, 89, 106, 189, 702/190, 191, 194
See application file for complete search history.

(56) References Cited

U.S. PATENT DOCUMENTS

| | | | |
|---|---|---|---|
| 6,298,315 B1 | 10/2001 | Li et al. | |
| 6,356,850 B1 | 3/2002 | Wilstrup et al. | |
| 6,671,334 B1* | 12/2003 | Kuntz et al. | 375/340 |
| 6,795,496 B1* | 9/2004 | Soma et al. | 375/226 |
| 6,799,144 B2 | 9/2004 | Li et al. | |
| 6,832,172 B2 | 12/2004 | Ward et al. | |
| 6,853,933 B2 | 2/2005 | Tan et al. | |
| 6,898,535 B2 | 5/2005 | Draving | |
| 7,254,168 B2 | 8/2007 | Guenther | |
| 7,339,984 B1 | 3/2008 | Daou | |
| 7,388,937 B1 | 6/2008 | Rodger et al. | |
| 2004/0210790 A1* | 10/2004 | Moon et al. | 713/500 |
| 2005/0218881 A1* | 10/2005 | Tanaka et al. | 324/76.11 |
| 2005/0243950 A1 | 11/2005 | Laquai et al. | |
| 2006/0045175 A1 | 3/2006 | Draving et al. | |
| 2006/0251200 A1 | 11/2006 | Miller | |
| 2007/0150218 A1* | 6/2007 | Akimoto | 702/69 |

FOREIGN PATENT DOCUMENTS

| | | |
|---|---|---|
| EP | 1 504 271 B1 | 11/2006 |
| EP | 1 508 813 B1 | 1/2007 |

OTHER PUBLICATIONS

"Agilent PSA Series Spectrum Analyzers Data Sheet," Agilent Technologies, Nov. 15, 2008.
"Infiniium DCA-J Agilent 86100C Wide-Bandwidth Oscilloscope Mainframe and Modules, Technical Specifications," Agilent Technologies, Apr. 23, 2010.

(Continued)

*Primary Examiner* — Alexander H Taningco
*Assistant Examiner* — Paul D Lee
(74) *Attorney, Agent, or Firm* — Miller Patent Services; Jerry A. Miller

(57) ABSTRACT

A clock timing signal derived from a clock timing source is converted into samples obtained at a plurality of sample times, each sample representing an amplitude of a clock timing signal at a corresponding sample time. A time-domain histogram of deterministic jitter (DJ) is derived from a plurality of the samples. A set of measurement-based data that is not derived from the samples is also received, from which a time-domain histogram of random jitter (RJ) is derived. A jitter measurement is determined by convolving the time-domain histograms of DJ and RJ. Tangible non-transitory computer-readable storage devices can contain instructions that when carried out on processor(s) carry out the above process An apparatus has a clock sampling unit and a signal analyzer to derive the measure of jitter. This abstract is not to be considered limiting, since other embodiments may deviate from the features described in this abstract.

68 Claims, 5 Drawing Sheets

OTHER PUBLICATIONS

"Agilent E5052B Signal Source Analyzer 10 MHz to 7 GHz, 26.5 GHz, or 110 GHz Data Sheet," Agilent Technologies, Mar. 11, 2009.
"Added resistor preserves crystal oscillator's low output jitter," Dr. Gary Giust, Planet Analog, Jun. 17, 2007.
"Converting Phase Noise (dBc/Hz) to Phase Jitter (ps RMS) for Large Data Sets," JitterTime Consulting, © 2006-2009.
"Jitter peaking and PLLs," Dr. Gary Giust, Signal Integrity, Sep. 13, 2007.
"Setting Up Your Oscilloscope to Measure Jitter," Dr. Gary Giust, Signal Integrity, Oct. 11, 2007.
"Infiniium 90000 Series Oscilloscopes Data Sheet," Agilent Technologies, Oct. 1, 2009.
Anonymous, "Understanding and Characterizing Timing Jitter," Figure 4.2, p. 13, Tektronix, Inc., 2003.
Anonymous, "MtronPTI's Oscillator Jitter Basics," MtronPTI, p. 1, ebook published on ebookbrowse Nov. 12, 2010.
Analui, "Data-Dependent Jitter in Serial Communications," IEEE Transactions on Microwave Theory and Techniques, vol. 53, No. 11, p. 1, Nov. 2005.

* cited by examiner

ANALYZING JITTER IN A CLOCK TIMING SIGNAL

CROSS REFERENCE TO RELATED DOCUMENTS

This application is related to and claims priority benefit of U.S. Provisional patent application No. 61/231,318 filed Aug. 5, 2009 which is hereby incorporated by reference.

COPYRIGHT AND TRADEMARK NOTICE

A portion of the disclosure of this patent document contains material which is subject to copyright protection. The copyright owner has no objection to the facsimile reproduction of the patent document or the patent disclosure, as it appears in the Patent and Trademark Office patent file or records, but otherwise reserves all copyright rights whatsoever. Trademarks are the property of their respective owners.

BACKGROUND

In serial-data transmission systems and standards, time-interval error (TIE) jitter, also referred to herein as jitter, is a term of art that can be defined as the variation of the significant instances of a signal from its ideal position in time. A data signal is generally sampled in time midway between its ideal edge transitions, where the data signal is stable and has reached a value that can be judged to be a high-level state or a low-level state. A clock timing signal is generally used to sample the data signal. Jitter can cause a transition in the data signal or clock timing signal to vary from its ideal location, and if large enough, jitter can push the transition in the data signal past its sampling point causing a bit error. One figure-of-merit for a serial-data transmission link is its bit-error ratio (BER), which is the number of erroneously received bits divided by the number of transmitted bits.

BRIEF DESCRIPTION OF THE DRAWINGS

Certain illustrative embodiments illustrating organization and method of operation, together with objects and advantages may be best understood by reference to the detailed description that follows taken in conjunction with the accompanying drawings in which.

DETAILED DESCRIPTION

Figure 1:
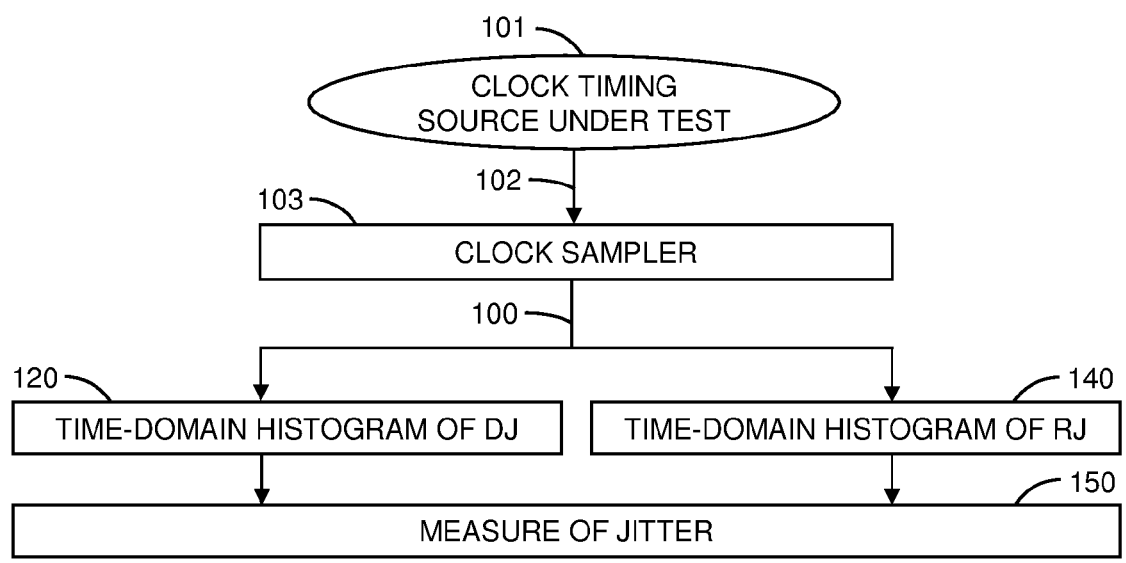
FIG. 1 is a representative flow chart of a method for analyzing jitter in a clock timing signal.

While this invention is susceptible of embodiment in many different forms, there is shown in the drawings and will herein be described in detail specific embodiments, with the understanding that the present disclosure of such embodiments is to be considered as an example of the principles and not intended to limit the invention to the specific embodiments shown and described. In the description below, like reference numerals are used to describe the same, similar or corresponding parts in the several views of the drawings.

The terms "a" or "an", as used herein, are defined as one or more than one. The term "plurality", as used herein, is defined as two or more than two. The term "another", as used herein, is defined as at least a second or more. The terms "including" and/or "having", as used herein, are defined as comprising (i.e., open language). The term "coupled", as used herein, is defined as connected, although not necessarily directly, and not necessarily mechanically. The term "program" or "computer program" or similar terms, as used herein, is defined as a sequence of instructions designed for execution on a computer system. A "program", or "computer program", may include a subroutine, a function, a procedure, an object method, an object implementation, in an executable application, an applet, a servlet, a source code, an object code, a shared library/dynamic load library and/or other sequence of instructions designed for execution on a computer system. The term "processor", "controller", "CPU", "Computer" and the like as used herein encompasses both hard programmed, special purpose, general purpose and programmable devices and may encompass a plurality of such devices or a single device in either a distributed or centralized configuration without limitation.

Reference throughout this document to "one embodiment", "certain embodiments", "an embodiment", "an example", "an implementation" or similar terms means that a particular feature, structure, or characteristic described in connection with the embodiment, example or implementation is included in at least one embodiment, example or implementation of the present invention. Thus, the appearances of such phrases or in various places throughout this specification are not necessarily all referring to the same embodiment, example or implementation. Furthermore, the particular features, structures, or characteristics may be combined in any suitable manner in one or more embodiments, examples or implementations without limitation.

The term "or" as used herein is to be interpreted as an inclusive or meaning any one or any combination. Therefore, "A, B or C" means "any of the following: A; B; C; A and B; A and C; B and C; A, B and C". An exception to this definition will occur only when a combination of elements, functions, steps or acts are in some way inherently mutually exclusive.

Analyzing jitter in a signal can help to identify and reduce sources of jitter in a system. Additionally, in certain situations jitter in a clock timing signal can appear as jitter in a data signal and lead to bit errors. Therefore, improved methods and apparatuses for analyzing jitter in the clock timing signal are needed to advance system performance.

The embodiments described herein may be realized in many different forms. The drawings show, and the text describes, one or more embodiments in specific detail with the understanding that such disclosure is to be considered exemplary of the principles of one or more embodiments and not intended to limit the scope to only those embodiments described herein. Note that the use of terminology herein for first, second, and third to describe an element is to be merely interpreted as a label, and does not imply timing or other specific attributes.

This application relates generally to jitter analysis and jitter measurement, and specifically to measuring and analyzing jitter in a clock timing signal. Hence, the embodiments herein pertain generally to analyzing jitter in the clock timing signal. In general, a clock timing signal is derived from a clock timing source, and the time between recurring edges of the clock timing signal is periodic or pseudo-periodic. The clock timing signal oscillates between a high-level state and a low-level state. The clock timing signal contains edges normally used to control the timing of actions. The clock timing signal has edges with a rising slope direction, and edges with a falling slope direction. For many applications, the clock timing signal is ideally a periodic wave such as a sine wave or a square wave, but the clock timing signal in practice may contain characteristics that make the waveform imperfect and therefore referred to herein as "pseudo-periodic", including variations in time of amplitude, pulse width, period, frequency, rise time, or fall time, for example. Furthermore, some imperfections are sometimes intentionally introduced onto the clock timing signal. For example, spread-spectrum technology introduces a controlled amount of frequency modulation onto the clock timing signal to minimize electromagnetic interference (EMI) emissions.

For example, the following clock timing sources normally output at least one clock timing signal: crystal oscillator (XO), voltage-controlled oscillator (VCO), voltage-controlled crystal oscillator (VCXO), voltage-controlled surface-acoustic wave (SAW) oscillator (VCSO), oven-controlled crystal oscillator (OCXO), temperature-controlled crystal oscillator (TCXO), programmable clock oscillator, PLL-based clock synthesizer, fractional-N clock synthesizer, SAW oscillator, micro-electro-mechanical systems (MEMS) oscillator, temperature-compensated MEMS oscillator (TCMO), clock-recovery unit (CRU), clock-generation integrated circuit (IC), distribution-buffer IC, jitter-attenuation IC, frequency-translation IC, clock-multiplier IC, spread-spectrum clock IC, clock IC, clock module, clock circuit, and a semiconductor chip that outputs the clock timing signal. The clock timing source does not comprise a serial-data transmitter, and the clock timing signal does not comprise a serial-data signal having a clock-like data pattern.

The total measured jitter in a signal, or total jitter (TJ), can be decomposed into one or more statistical components of jitter. For example, TJ may be separated into a random component and a deterministic component of jitter. The random component of total jitter, also referred to herein as random jitter (RJ), may be created by random noise that can be characterized by a Gaussian distribution having tails extending to infinity. The deterministic component of total jitter, also referred to herein as deterministic jitter (DJ), may be created by system mechanisms (such as crosstalk, reflections, loss) and/or bandwidth limitations (such as inter-symbol interference) that may be characterized by a distribution that is bounded in time. DJ may be further separated into various other components of jitter, such as periodic jitter, duty-cycle dependent jitter, data-dependent jitter, and bounded uncorrelated jitter.

Various measurement technologies can be used to provide time-domain information for jitter in the clock timing signal. For example, a sampling oscilloscope uses a measurement technology based on time sampling an input signal. A real-time sampling oscilloscope (also called a digital storage oscilloscope) is one type of sampling oscilloscope that can be used for analyzing jitter. An equivalent-time sampling oscilloscope is another type of sampling oscilloscope that can be used for analyzing jitter.

Other measurement technologies can provide frequency-domain information related to jitter in the clock timing signal. For example, a spectrum analyzer and a phase-noise analyzer are two measurement technologies that can be used for analyzing jitter by spectral analysis. The phase-noise analyzer can present measured phase-noise data in the form of a phase-noise spectrum, also referred to as a phase noise plot, for subsequent analysis. Phase-deviations in the clock timing signal are known as phase noise, which generally has random phase fluctuations disrupting a periodic signal's linear phase trend. Phase noise can be characterized as a power spectral density of phase fluctuations, and can have assigned units of decibels relative to the carrier in a 1-Hz bandwidth, denoted by dBc/Hz, and may be associated with a particular frequency offset from the carrier frequency. Phase noise data comprises one or more phase noise data points. An example phase noise data point may be −102 dBc/Hz at an offset frequency of 10 KHz. The Random Jitter (RJ) in the clock timing signal may be derived from the phase-noise data.

The phase-noise analyzer measurement may be categorized as a one-port or a two-port measurement. The one-port measurement can characterize the phase noise in the clock timing signal output by the clock timing source, whereas the two-port measurement can characterize the phase noise added by the clock timing source to the clock timing signal as the clock timing signal passes between input and output ports of the clock timing source.

A spectrum analyzer may be based on superheterodyne technology, and may also be referred to as a swept-frequency analyzer or a superheterodyne analyzer. Superheterodyne technology can refer to reducing an incoming signal in frequency by mixing. The spectrum analyzer based on superheterodyne technology can measure spectral-power, but may present data in terms of power spectral density, and therefore phase-noise data, of the clock timing signal. The RJ in the clock timing signal may be derived from spectral-power data.

FIG. 1 is a representative flow chart of a method for analyzing jitter in a clock timing signal 102. The flow chart of FIG. 1 begins by a clock sampler 103 converting the clock timing signal 102 derived from a clock timing source under test 101 into a plurality of samples 100 obtained at a plurality of sample times, wherein each sample represents an amplitude of the clock timing signal 102 at a corresponding sample time. The plurality of samples 100 may be derived from the clock timing signal 102 using a clock sampler 103 that time-samples the clock timing signal's amplitude using, for example, a technology similar to that used by the real-time sampling oscilloscope. A series of values for total jitter (TJ) can be derived from the plurality of samples 100. Spectral decomposition or other methods can be used to derive the time-domain histogram of DJ 120 and the time-domain histogram of RJ 140 from the series of values for TJ. A measure of jitter 150 may be determined based on a calculation resulting in a convolution of the time-domain histogram of DJ 120 and the time-domain histogram of RJ 140. This method can be implemented, for example, within the real-time sampling oscilloscope.

Because both the DJ and RJ histograms are produced from the same collection of samples obtained using a selected measurement instrument, the accuracy of the measured result may degrade when the level of DJ and/or RJ from the clock timing source 102 is near or below the noise floor of the selected measurement instrument. For example, the clock timing source 102 can have lower DJ and/or RJ than a sampling oscilloscope. If the clock timing source 102 were to be measured with a sampling oscilloscope having larger DJ and/or RJ than the clock timing source 102, then the accuracy of the measured results would be degraded by the measurement instrument (e.g. the sampling oscilloscope), leading to a false estimation of the level of jitter present in the clock timing source 102.

Certain example mechanisms by which the embodiments herein benefit the analysis of jitter in clock timing signals are described below with reference to FIGS. 2 through 6.

The phase-noise analyzer can have one of the lowest noise floors of any measurement technology. As such, phase-noise data derived from the phase-noise analyzer may be used to extract a very accurate measure of RJ in the clock timing signal 102. The noise floor of the spectrum analyzer based on superheterodyne technology can be lower than the noise floor of the real-time sampling oscilloscope. The spectrum analyzer based on superheterodyne technology can therefore provide a more accurate measure of RJ for low levels of RJ in the clock timing signal 102 than the real-time sampling oscilloscope. However, the real-time sampling oscilloscope can employ Fourier analysis techniques to provide a frequency spectrum of jitter in the clock timing signal 102 that can be an advantage for analyzing DJ in the clock timing signal 102. One advantage of Fourier analysis is that phase and amplitude information are retained. By contrast, the phase-noise analyzer, which measures phase noise, and the spectrum analyzer based on superheterodyne technology, which measures spectral power, only retain amplitude information, which can make it difficult to derive an accurate measure of deterministic jitter (DJ) in the clock timing signal 102. For example, without phase information, if multiple spurs appear in the phase-noise or spectral power data, it can be difficult to determine whether or not these spurs are harmonics of each other, and therefore how these spurs combine to produce DJ can be difficult to determine. Additionally, frequency spectrums derived through Fourier analysis of data obtained from the real-time sampling oscilloscope can have better frequency resolution than comparable spectrums obtained from the phase-noise analyzer or the spectrum analyzer based on superheterodyne technology. By appropriately combining the advantages of more than one measurement technology, the example embodiments herein can provide advantages for analyzing jitter in the clock timing signal 102 compared to an analysis based on any one measurement technology alone, especially for low levels of jitter in the clock timing signal 102.

Figure 2:
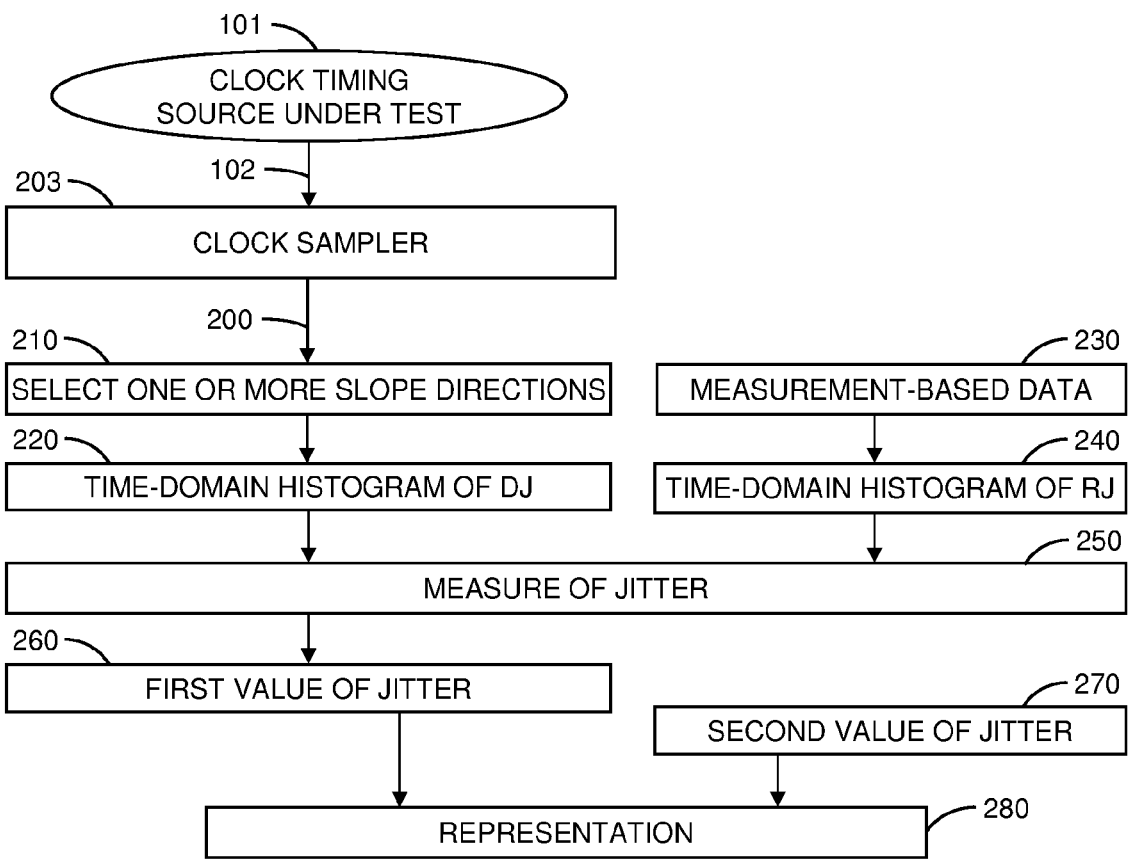
FIG. 2 is a flow chart of a method for analyzing jitter in a clock timing signal in accordance with certain embodiments consistent with the present invention.

A flow chart depicting an example of certain embodiments consistent with the present invention for analyzing jitter in the clock timing signal 102 is shown in FIG. 2. The flow chart of FIG. 2 begins by a clock sampler 203 converting the clock timing signal 102 derived from the clock timing source under test 101 into a plurality of samples 200 obtained at a plurality of sample times, wherein each sample represents an amplitude of the clock timing signal 102 at a corresponding sample time. As described above, the clock timing signal 102 contains edges having rising and falling slope directions. The clock sampler 203 may derive the plurality of samples 200, for example, from time-sampled voltage measurements obtained through one or more acquisitions of the clock timing signal 102 using technology similar to that used by the real-time sampling oscilloscope. The duration of each acquisition should be sufficiently long to capture the lowest jitter frequency of interest in the clock timing signal 102. For example, according to Nyquist, a sine wave must be sampled at least two times per cycle to avoid aliasing effects. Thus, a real-time sampling oscilloscope with a timebase setting of one microsecond (1 us) per division and ten divisions of horizontal scale can capture jitter frequencies having a cycle smaller than about 10 times 1 us, or 10 us, which corresponds to a frequency of 100 KHz. If lower jitter frequencies are desired to be measured, the timebase setting should be increased accordingly.

Because it can be useful to analyze jitter associated with one of rising edges-only, falling edges-only, and all edges in the clock timing signal, the samples selected for subsequent analysis may correspond with one or more slope directions 210 that can be optionally selected in the clock timing signal edges without limitation.

A time-domain histogram of DJ 220 may be derived from the plurality of samples 200, or at least some of the plurality of samples (e.g. a plurality of the samples). For analyzing jitter in one of rising and falling edges in the clock timing signal, the time-domain histogram of DJ 220 is derived from a plurality of the samples associated with clock timing signal edges having one slope direction and none of the samples associated with clock timing signal edges having a second slope direction. More specifically in one example, for analyzing jitter in rising edges-only of the clock timing signal, the time-domain histogram of DJ 220 is derived from a plurality of the samples associated with rising edges of the clock timing signal and none of the samples associated with falling edges of the clock timing signal. Likewise, for analyzing jitter in falling edges-only of the clock timing signal, the time-domain histogram of DJ 220 is derived from a plurality of the samples associated with falling edges of the clock timing signal and none of the samples associated with rising edges of the clock timing signal.

The time-domain histogram of DJ 220 can be characterized by a bounded distribution, within which bounds the distribution may take any shape as determined by the statistical nature of its source. The time-domain histogram of DJ 220 may be derived using one of a wide variety of methods. For example, the time-domain histogram of DJ 220 may be modeled to approximate an actual distribution, or simply modeled as two equal-probability impulse functions separated by a certain amount.

A set of measurement-based data 230 associated with the clock timing signal 102 is received, wherein the set of measurement-based data 230 is not derived from the same plurality of samples 200. The time-domain histogram of RJ 240 is derived from the set of measurement-based data 230. This method can potentially produce a more accurate time-domain histogram of RJ 240 than the time-domain histogram of RJ produced by 140. For purposes of this document, the term "measurement-based data" should be interpreted to mean a data set derived from one or more measurements derived from the clock timing signal 102. In this example, the measurement-based data 230 is not derived from the plurality of samples 200. For example, the measurement-based data of 230 may be obtained from a different source of data (e.g. a different measurement instrument) than the source of data (e.g. measurement instrument) used to produce the plurality of samples used in 200, 210 and 220. For example, one source of data may be the real-time sampling oscilloscope, and another source of data may be the phase-noise analyzer.

This approach is different than that shown in FIG. 1, which is limited to using the plurality of samples 100 from one source of data (e.g. measurement instrument) to derive both the time-domain histogram of DJ 120 and the time-domain histogram of RJ 140. The additional degree of freedom provided by deriving the time-domain histogram of RJ 240 from the set of measurement-based data 230 enables the use of a different, and potentially better, measurement technology than otherwise possible. The benefits of this approach increase as the level of jitter in the clock timing signal 102 decreases. For example, this approach may be used to combine the advantage of the real-time sampling oscilloscope for deriving the time-domain histogram of DJ 220 in the clock timing signal 102 with the advantage of another measurement technology, such as one of the phase-noise analyzer and the spectrum-analyzer based on superheterodyne technology, for deriving the time-domain histogram of RJ 240 in the clock timing signal 102. This approach, for example, can overcome the inherent noise floor disadvantage of the real-time sampling oscilloscope for deriving the time-domain histogram of RJ 240 in clock timing signals having low levels of jitter, and the difficulty of the phase-noise analyzer or spectrum analyzer based on superheterodyne technology for deriving the time-domain histogram of DJ 220 in the clock timing signal 102.

In at least one example embodiment, the clock timing signal 102 from the clock timing source under test 101 is converted into the plurality of samples 200 using the real-time sampling oscilloscope. In at least another example embodiment, the plurality of samples 200 is derived from a first source of data that comprises the real-time sampling oscilloscope, and the set of measurement-based data 230 is derived from a second source of data that is different from the first source of data. In at least a further example embodiment, the set of measurement-based data 230 comprises one of phase-noise data and spectral-power data, wherein the phase-noise data and the spectral-power data are not derived from the plurality of samples 200. In at least another different example embodiment, the set of measurement-based data 230 comprises the phase-noise data, wherein the phase-noise data is derived from the phase-noise analyzer. In at least one other example embodiment, the set of measurement-based data 230 comprises the spectral-power data, wherein the spectral-power data is derived from the spectrum analyzer based on superheterodyne technology. In at least an additional example embodiment the set of measurement-based data 230 comprises at least one of the following sets of data, wherein each set of data is not derived from the plurality of samples 200: a root mean square (RMS) value; a standard deviation value; a variance value; at least one jitter value; at least one bit-error ratio value; at least one Q-scale function value.

A measure of jitter at 250 is determined based on the calculation resulting in a convolution of the time-domain histogram of DJ 220 and the time-domain histogram of RJ 240. The measure of jitter 250, for example, may be a number such as an expression in units of peak seconds, peak-to-peak seconds, RMS seconds, peak unit intervals (UI), peak-to-peak UI, RMS UI, decibels (dB), decibels relative to the carrier (dBc), dBc/Hertz, or percentage of another quantity. The measure of jitter 250 may also be an indication or means of assessing the degree, extent, statistical nature, or quality of the jitter in the clock timing signal 102. The measure of jitter 250 may be in the form of a graph, plot, figure, illustration, or other representation. The measure of jitter 250 may be a statistical measure, such as an RMS, standard deviation, variance, peak, or peak-to-peak quantity. The measure of jitter 250 may quantify the random component or deterministic component of TJ, or quantify eye-diagram timing information such as eye closure or eye opening. Such a measure can be displayed, stored, entered into a database or spreadsheet or otherwise utilized as needed by a user.

The measure of jitter 250 can be obtained by first deriving the time-domain histogram of TJ. An accurate representation of the time-domain histogram of TJ, including tail regions, may be obtained by mathematically convolving the time-domain histogram of DJ 220 and the time-domain histogram of RJ 240, assuming they are statistically independent and uncorrelated. Alternatively, convolution in the time domain may be performed by multiplication in the frequency domain, wherein the Fourier transform of a function $f$ is multiplied by the Fourier transform of a function g, and the result is inverse Fourier transformed back into the time domain.

In certain embodiments, the measure of jitter 250 comprises a first value of jitter 260, and a second value of jitter 270 is obtained (note that first and second do not necessarily denote a time sequence). The second value of jitter 270 is not derived from the time-domain histogram of DJ 220 and/or the time-domain histogram of RJ 240. Certain applications may benefit by comparing the first value of jitter 260 and the second value of jitter 270. For example, the second value of jitter 270 may represent a threshold for judging quality or performance used by manufacturing during production testing to determine a pass or fail status before committing a product for shipment. Alternatively, the second value of jitter 270 may be derived from a quantity of jitter documented in a standard as a specification for jitter, wherein comparing the first value of jitter 260 and the second value of jitter 270 can be useful to determine a status of pass or fail, or a measure of the amount consumed or margin remaining for the first value of jitter 260 with respect to the second value of jitter 270 (or vice versa). The specification for jitter may be classified by the standard as a normative or an informative specification.

Certain embodiments generate at least one of the following representations 280 based on the first value of jitter 260 and the second value of jitter 270: a magnitude comparison indicator indicating a relative magnitude of the first value of jitter to the second value of jitter; a magnitude comparison indicator indicating a relative magnitude of the second value of jitter to the first value of jitter; a margin comparison indicator indicating relative margin between the first value of jitter and the second value of jitter; a margin comparison indicator indicating relative margin between the second value of jitter and the first value of jitter; a pass/fail indicator indicating whether the first value of jitter is one of larger and smaller than the second value of jitter; a result based on a computation of an equation including the first value of jitter and the second value of jitter; and a representation derived from the first value of jitter and the second value of jitter.

In some embodiments, the second value of jitter 270 is derived from the quantity of jitter documented in the standard as the specification for jitter. In certain embodiments the standard comprises a standard that is administered, written, maintained, or provided by at least one organization selected from the group consisting of: Society of Motion Picture Television Engineers (SMPTE), Institute of Electrical and Electronics Engineers (IEEE), Peripheral Component Interconnect Special Interest Group (PCI-SIG), Telcordia Technologies Inc., American National Standards Institute (ANSI), International Telecommunication Union (ITU), Optical Internetworking Forum (OIF), Serial Advanced Technology Attachment International Organization (SATA-IO), International Committee for Information Technology Standards (INCITS), Common Public Radio Interface (CPRI) Cooperation, Infiniband Trade Organization, RapidIO Trade Association, Small Form Factor (SFF) Committee, Ethernet Alliance, Video Electronics Standards Association (VESA), High-Definition Multimedia Interface (HDMI) Licensing LLC, HyperTransport Consortium, InfiniB and Trade Association, International Electrotechnical Commission (IEC), and Universal Serial Bus (USB) Implementer's Forum (USB-IF). This list is not intended to be all inclusive, but is provided by way of example. Other illustrative groups could include private organizations who wish to establish internal standards, or by individuals.

For example, some standards are listed in Table 1.

TABLE 1

SMPTE 259M
SMPTE 344M
SMPTE 292M
SMPTE 372M
SMPTE 424M
IEEE 802.3ae
IEEE 802.3an
IEEE 802.3av
IEEE 802.3ba
Telcordia GR-253-CORE
ANSI T1.105
ITU-Telecommunication Standardization Sector (ITU-T) G.707
OIF-CEI-02.0
SATA Revision 1.x
SATA Revision 2.x
SATA Revision 3.x
CPRI V4.0
Fibre Channel FC-PI-4
Fibre Channel FC-PI
Infiniband Architecture Specification Volume 1
Infiniband Architecture Specification Volume 2
Serial Attached Small Computer System Interface
Serial RapidIO (SRIO) Rev. 1.3
SRIO Rev. 2.0
SFF INF-8077i
SFF-8431.

The phase-noise spectrum may be obtained directly from the phase-noise analyzer, or indirectly by converting spectral-power data obtained from the spectrum analyzer based on superheterodyne technology into phase-noise data. Alternatively, multiple phase-noise spectrums may be averaged to characterize the phase-noise of the clock timing signal 102. The use of one or more jitter filters can be used in applications related to serial-data transmission standards. Although a hardware jitter filter could be applied to the clock timing signal 102 before measuring phase noise, a software jitter filter may be applied to the phase-noise spectrum to avoid introducing additional hardware jitter while accurately controlling the frequency response of the jitter filter.

One method for deriving the time-domain histogram of RJ 240 uses a Gaussian model. The phase-noise data may be integrated over a range of offset-frequencies to derive an RMS value of RJ in the clock timing signal. For example, the following equation can convert the phase noise data to RJ, $J_{RMS}$, in units of RMS seconds, wherein the phase-noise data in dBc/Hz as a function of offset frequency is given by L(f), and the carrier frequency in Hertz is Fc.

$$J_{RMS} = \frac{\sqrt{2 \int 10^{\frac{L(f)}{10}} df}}{2\pi F_C}$$

An RJ distribution may then be modeled as a zero-mean Gaussian distribution having the standard deviation equal to the RMS value of RJ. For example, the following equation is a zero-mean Gaussian probability density function (PDF), p(x), for a continuous random variable x, modeled with the standard deviation value of $v=J_{RMS}$.

$$p(x) = \frac{e^{\frac{-x^2}{2v^2}}}{v\sqrt{2\pi}}$$

The resulting RJ distribution can be expressed as the time-domain histogram of RJ 240, which may then be convolved with the time-domain histogram of DJ 220.

Figure 3A:
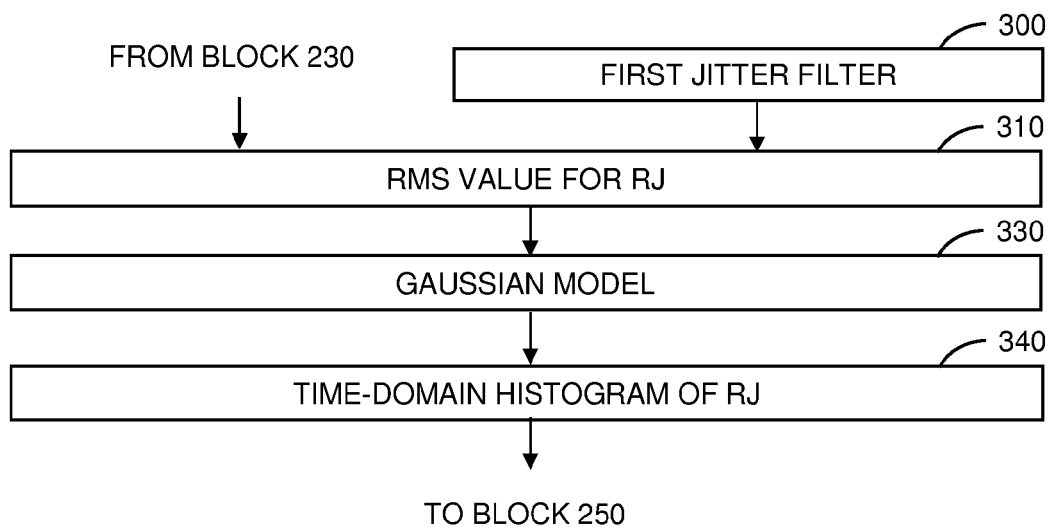
FIG. 3A is a flow chart of a method for calculating a time-domain histogram of random jitter using a jitter filter in accordance with certain embodiments consistent with the present invention.

Certain embodiments substitute FIG. 3A for block 240 in FIG. 2. In some embodiments the set of measurement-based data 230 comprises phase-noise data, and deriving the time-domain histogram of RJ 240 comprises: deriving the RMS value of RJ 310 from the phase-noise data 230 and a first jitter filter 300, and deriving the time-domain histogram of RJ 340 from the Gaussian model 330 having the standard deviation equal to the RMS value of RJ 310. At least one embodiment exists for deriving the RMS value of RJ 310 from the first jitter filter 300 and an average of at least two phase-noise spectrums, wherein each phase-noise spectrum is derived from the clock timing signal 102.

In some example embodiments the set of measurement-based data 230 comprises spectral-power data, and deriving the time-domain histogram of RJ 240 comprises: deriving the RMS value of RJ 310 from the spectral-power data 230 and a first jitter filter 300, and deriving the time-domain histogram of RJ 340 from the Gaussian model 330 having the standard deviation equal to the RMS value of RJ 310. At least one embodiment exists for deriving the RMS value of RJ 310 from the first jitter filter 300 and an average of at least two sets of spectral-power data, wherein each set of spectral-power is derived from the clock timing signal 102.

Figure 3B:
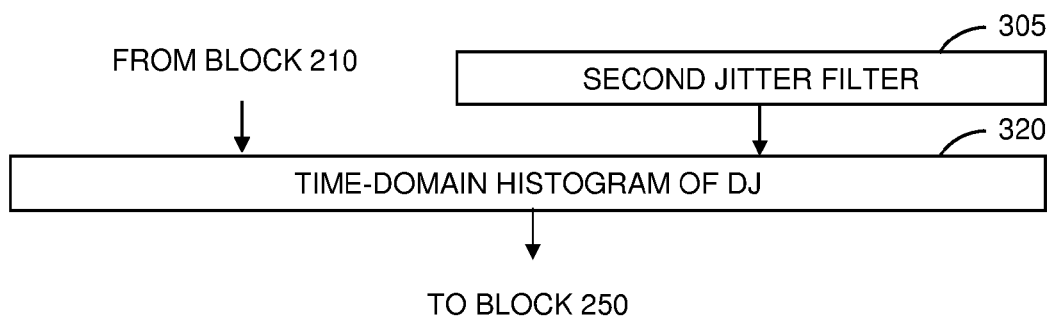
FIG. 3B is a flow chart of a method for calculating a time-domain histogram of deterministic jitter using a jitter filter in accordance with certain embodiments consistent with the present invention.

Certain example embodiments substitute FIG. 3B for block 220 in FIG. 2. In some embodiments deriving the time-domain histogram of DJ 220 comprises deriving the time-domain histogram of DJ 320 from a second jitter filter 305 and a plurality of the samples 200 associated with clock timing signal edges having one slope direction and none of the samples associated with clock timing signal edges having a second slope direction. Here, the term "second" refers to a jitter filter that may be different than the first jitter filter 300. Block 210 is a selection of edges, and this example relates to one possible selection. The second jitter filter 305 may be the same as the first jitter filter 300 or a different jitter filter.

Figure 4:
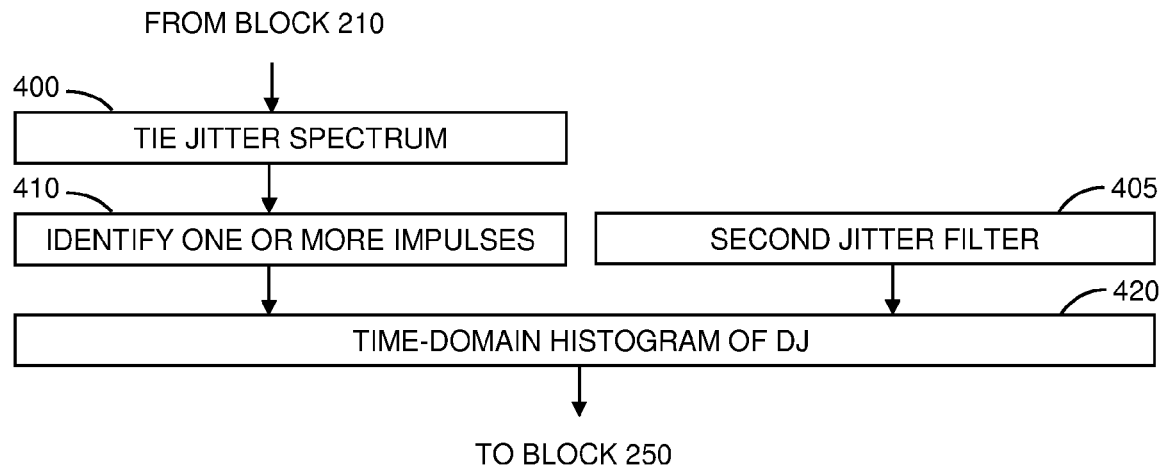
FIG. 4 is a flow chart of a method for calculating a time-domain histogram of deterministic jitter in accordance with certain embodiments consistent with the present invention.

Certain example embodiments substitute FIG. 4 for block 220 in FIG. 2. The method shown in FIG. 4 uses spectral decomposition to derive the time-domain histogram of DJ 420. The flow chart depicted in FIG. 4 may be implemented as follows. The real-time sampling oscilloscope or clock sampler 203 can derive the plurality of samples 200 from the clock timing signal 102. A series of jitter values can be derived from the plurality of samples 200. A discrete Fourier transform (DFT) could be applied to the series of jitter values to obtain a TIE jitter spectrum 400. To reduce the effects of spectral leakage, a processing window (for example, rectangular, flat-top, Blackman, Blackman-Harris, Hamming, Hanning, Han or other window) may optionally be applied to the series of jitter values before applying the DFT. Any deterministic spectral components, appearing as impulses 410, also called spurs, in the TIE jitter spectrum, if present, may then be identified. A modified TIE jitter spectrum may then be created containing or emphasizing only those spectral components identified as impulses 410. Frequency-bins not associated with impulses 410 may be made to be zero or otherwise attenuated. A second jitter filter 405 may be applied to the modified TIE jitter spectrum. Here, the term "second" refers to a jitter filter that may be different than the first jitter filter 300. An inverse DFT may then be applied to the modified TIE jitter spectrum to obtain a series of DJ-only jitter values. If the processing window was applied before deriving the TIE jitter spectrum above, the effect of this processing window may be reversed after performing the inverse DFT. The series of DJ-only jitter values may then be used to derive the time-domain histogram of DJ 420.

In relation to FIG. 2 and FIG. 4, at least one embodiment for deriving the time-domain histogram of DJ 220 comprises: deriving the TIE jitter spectrum 400 from a plurality of the samples 200 associated with clock timing signal edges having one slope direction and none of the samples associated with clock timing signal edges having a second slope direction; identifying one or more impulses 410 in the TIE jitter spectrum; and determining the time-domain histogram of DJ 420 based on a calculation resulting in applying an inverse-discrete Fourier transform to a spectrum derived from the second jitter filter 405 and the one or more impulses 410.

Figure 5:
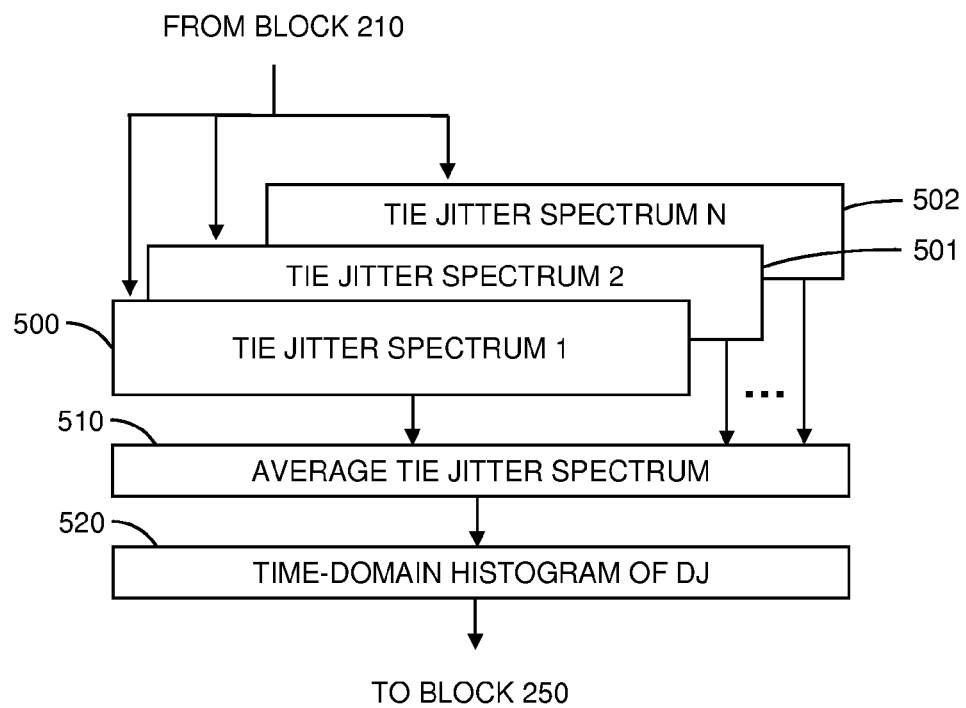
FIG. 5 is a flow chart of a method for calculating a time-domain histogram of deterministic jitter based on an average time-interval error jitter spectrum in accordance with certain embodiments consistent with the present invention.

Certain embodiments substitute FIG. 5 for block 220 in FIG. 2. The flow chart shown in FIG. 5 derives the time-domain histogram of DJ 220 from an average of at least two TIE jitter spectrums. This method could start, for example, with using the real-time sampling oscilloscope to capture more than one acquisition of time-sampled values from the clock timing signal 102, wherein the plurality of samples 200 comprises a plurality of time-sampled values from a plurality of acquisitions. Each TIE jitter spectrum 500-502 may be derived from each acquisition of time-sampled values for the selected one or more slope directions 210. The average of at least two TIE jitter spectrums may therefore be computed. The process of averaging may use any suitable method. One method of averaging creates a modified spectrum having an amplitude equal to the average of the magnitudes of at least two TIE jitter spectrums at corresponding frequency bins, and a phase of one TIE jitter spectrum. A variation of this method uses a weighted-average over a plurality of TIE jitter spectrums. Another variation uses a running average of TIE jitter spectrums based on using an exponential weighting, for example. Regardless of how the average TIE jitter spectrum 510 is obtained, the average TIE jitter spectrum 510 may be used to derive the time-domain histogram of DJ 520. For example, spectral decomposition as discussed above may be used to derive the time-domain histogram of DJ 520. One or more jitter filters may be applied to each TIE jitter spectrum 500-502, or to the average TIE jitter spectrum 510, before deriving the time-domain histogram of DJ 520.

In relation to FIG. 5, at least one embodiment for deriving the time-domain histogram of DJ 220 comprises deriving more than one TIE jitter spectrum 500-502 (for example, three TIE jitter spectrums 500-502 are shown, but this is not intended to be limiting) from the plurality of samples, wherein each TIE jitter spectrum 500-502 is derived from a plurality of the samples 200 associated with clock timing signal edges having one slope direction and none of the samples associated with clock timing signal edges having a second slope direction; deriving an average TIE jitter spectrum 510 from at least two of the TIE jitter spectrums 500-502, wherein the TIE jitter spectrums 500-502 used to derive the average TIE jitter spectrum 510 are all associated with a common slope direction; and deriving the time-domain histogram of DJ 520 from the average TIE jitter spectrum 510.

Figure 6:
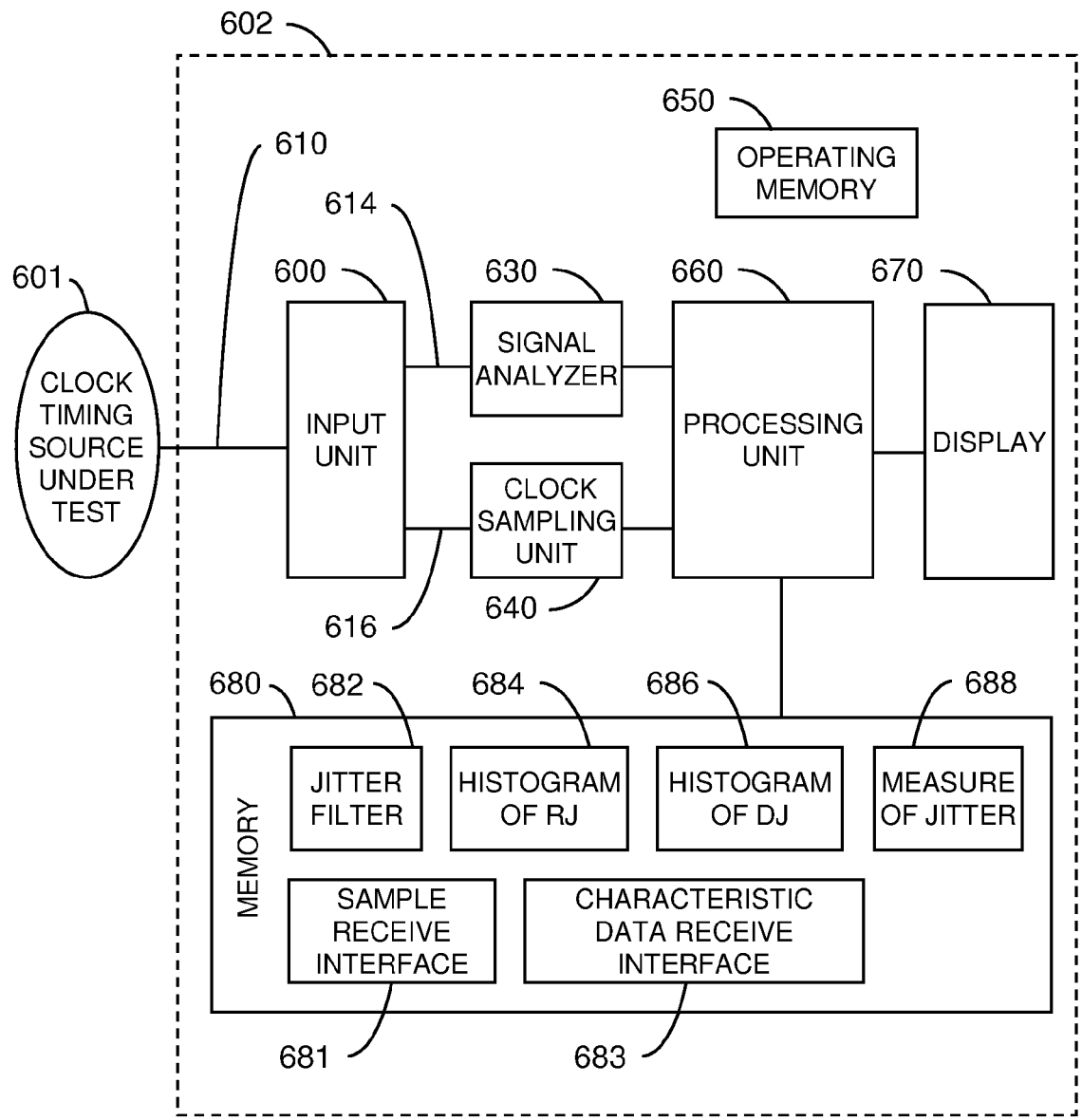
FIG. 6 is a block diagram of an apparatus for analyzing jitter in a clock timing signal in accordance with certain embodiments.

An example apparatus 602 for implementing certain embodiments is shown in FIG. 6. An input unit 600 comprises at least one input, including a suitable clock signal interface for receipt of a clock timing signal 610 derived from a clock timing source under test 601, that receives the clock timing signal 610, wherein the clock timing signal 610 has edges with rising and falling slope directions. The input unit 600 may be designed to accept clock timing signals that are single-ended or differential. The clock timing signal 610 received by the input unit may be transmit using any suitable signaling type, such as transistor-transistor logic (TTL), low-voltage TTL (LVTTL), stub series terminated logic (SSTL), complementary metal-oxide-semiconductor (CMOS), low-voltage CMOS (LVCMOS), emitter-coupled logic (ECL), positive ECL (PECL), low-voltage PECL (LVPECL), low-voltage differential signaling (LVDS), current-mode logic (CML), and high-speed transceiver logic (HSTL) or others without limitation.

The signal analyzer 630 receives a first test signal 614 from the input unit 600 and measures a set of characteristic data derived from the first test signal 614, wherein the first test signal 614 is derived from the clock timing signal 610. A clock sampling unit or clock sampler 640 receives a second test signal 616 from the input unit 600 and samples the second test signal 616 to obtain the plurality of samples as described above, with each sample representing an amplitude of the second test signal 616 at a corresponding sample time, wherein the second test signal 616 is derived from the clock timing signal 610. The clock sampling unit 640 may use a similar technology for time sampling the clock timing signal 610 as the real-time sampling oscilloscope. The second test signal 616 may be the same as the first test signal 614, for example, if a controlled switch (such as a demultiplexer) or a splitter (such as a power splitter or a distribution buffer) is used in the input unit 600 to distribute the first test signal 614 to the signal analyzer 630 and/or the clock sampling unit 640. Although test signal 614 may be the same test signal as 616, the clock sampling unit 640 generates a different set of samples than those used by signal analyzer 630.

At least one memory 680 with sufficient storage may or may not be utilized to connect directly to the signal analyzer 630 and/or the clock sampling unit 640 to hold the characteristic data and/or the plurality of samples before being received by at least one processing unit 660 (i.e., one or more programmed processors or computers or controller or hard wired processing devices). The at least one memory 680 connects to the at least one processing unit 660. Operating memory 650 and may also be available to the at least one processing unit 660 and/or other blocks. Any of the memories mentioned above may comprise any type of memory used to store digital data, including but not limited to random access memory (RAM), magnetic, optical, hard drive, SRAM, DRAM, EPROM, EEPROM, flash or other volatile or non-volatile memory.

The at least one processing unit 660 connects to the at least one memory 680 to process the set of characteristic data and the plurality of samples. The at least one memory 680 may include a sample receive interface 681 to receive the plurality of samples, and may include a characteristic data receive interface 683 to receive the set of characteristic data. The at least one processing unit 660 derives a time-domain histogram of random jitter (RJ) 684 from the set of characteristic data. The at least one processing unit 660 computes a time-domain histogram of deterministic jitter (DJ) 686 derived from a plurality of the samples. The at least one processing unit 660 computes a measure of jitter 688 based on a calculation resulting in a convolution of the time-domain histogram of DJ 686 and the time-domain histogram of RJ 684. The measure of jitter 688 may be output to an optional display 670 or may be stored to a database, to a spreadsheet, or as a data point for any suitable use by retrieval.

In at least one example embodiment the at least one processing unit 660 computes at least one jitter filter 682, and uses the at least one jitter filter 682 in computing at least one of: the time-domain histogram of RJ 684 derived from the set of characteristic data, and the time-domain histogram of DJ 688 derived from a plurality of the samples.

Differential signaling is a method of transmitting information electrically by means of two complementary signals sent on two separate conductors. A differential clock timing signal comprises two clock timing signals transmitted using differential signaling. The clock timing signals present on the two conductors comprising the differential clock timing signal may be subtracted from each other to create a difference clock timing signal that can have significant instants in time located at zero-volt crossings. The difference clock timing signal may be derived in practice, for example, using a hardware balun, or by digital processing in hardware or software. The embodiments herein apply equally to the clock timing signal, the difference clock timing signal, and the differential clock timing signal. Thus, differential as well as single-ended signaling can be used.

Thus, in certain embodiments a measure of jitter is based on a calculation resulting in a convolution of a histogram of deterministic jitter and a histogram of random jitter, wherein the histogram of deterministic jitter is derived from time-sampled data of a clock timing signal, and the histogram of random jitter is derived from a different source of data. At least one embodiment, among others, derives the histogram of random jitter from one of phase-noise data and spectral-power data of the clock timing signal. Some embodiments generate a representation based on a first value of jitter and a second value of jitter, wherein the first value of jitter is the measure of jitter. Other embodiments concern an apparatus for deriving the measure of jitter based on a clock sampling unit and a signal analyzer.

A plurality of samples obtained at a plurality of sample times is received, each sample representing an amplitude of a clock timing signal at a corresponding sample time. A time-domain histogram of deterministic jitter (DJ) is derived from at least some of the plurality of samples. A set of measurement-based data that is not derived from the plurality of samples is also received. A time-domain histogram of random jitter (RJ) is derived from the set of measurement-based data. A measure of jitter is determined based on a calculation resulting in a convolution of the time-domain histogram of DJ and the time-domain histogram of RJ. An apparatus combines a clock sampling unit and a signal analyzer to derive the measure of jitter.

A method consistent with certain implementations involves at a clock sampler, converting a clock timing signal derived from a clock timing source into a plurality of samples obtained at a plurality of sample times, each sample representing an amplitude of the clock timing signal at a corresponding sample time, wherein the clock timing signal has edges with rising and falling slope directions; deriving a time-domain histogram of deterministic jitter (DJ) from a plurality of the samples; receiving a set of measurement-based data that is not derived from the plurality of samples; deriving a time-domain histogram of random jitter (RJ) from the set of measurement-based data; and determining a measure of jitter based on a calculation resulting in a convolution of the time-domain histogram of DJ and the time-domain histogram of RJ.

In certain implementations, the plurality of samples is derived from a first source of data that comprises a real-time sampling oscilloscope, and the set of measurement-based data is derived from a second source of data that is different from the first source of data. In certain implementations, the measure of jitter comprises a first value of jitter, and the method further involves: obtaining a second value of jitter; and generating at least one of the following based on the first value of jitter and the second value of jitter: a magnitude comparison indicator indicating a relative magnitude of the first value of jitter to the second value of jitter; a magnitude comparison indicator indicating a relative magnitude of the second value of jitter to the first value of jitter; a margin comparison indicator indicating relative margin between the first value of jitter and the second value of jitter; a margin comparison indicator indicating relative margin between the second value of jitter and the first value of jitter; a pass/fail indicator indicating whether the first value of jitter is one of larger and smaller than the second value of jitter; a result based on a computation of an equation including the first value of jitter and the second value of jitter; and a representation derived from the first value of jitter and the second value of jitter.

In certain implementations, the second value of jitter is derived from a quantity of jitter documented in a standard as a specification for jitter. In certain implementations, deriving the time-domain histogram of DJ comprises deriving the time-domain histogram of DJ from a plurality of the samples associated with clock timing signal edges having one slope direction and none of the samples associated with clock timing signal edges having a second slope direction. In certain implementations, the measure of jitter comprises a first value of jitter, and the method further involves: obtaining a second value of jitter; and generating at least one of the following based on the first value of jitter and the second value of jitter: a magnitude comparison indicator indicating a relative magnitude of the first value of jitter to the second value of jitter; a magnitude comparison indicator indicating a relative magnitude of the second value of jitter to the first value of jitter; a margin comparison indicator indicating relative margin between the first value of jitter and the second value of jitter; a margin comparison indicator indicating relative margin between the second value of jitter and the first value of jitter; a pass/fail indicator indicating whether the first value of jitter is one of larger and smaller than the second value of jitter; a result based on a computation of an equation including the first value of jitter and the second value of jitter; and a representation derived from the first value of jitter and the second value of jitter.

In certain implementations, the second value of jitter is derived from a quantity of jitter documented in a standard as a specification for jitter. In certain implementations, the standard comprises a standard that is administered, written, maintained, or provided by at least one organization selected from the group consisting of: Society of Motion Picture Television Engineers (SMPTE), Institute of Electrical and Electronics Engineers (IEEE), Peripheral Component Interconnect Special Interest Group (PCI-SIG), Telcordia Technologies Inc., American National Standards Institute (ANSI), International Telecommunication Union (ITU), Optical Internetworking Forum (OIF), Serial Advanced Technology Attachment International Organization (SATA-IO), International Committee for Information Technology Standards (INCITS), Common Public Radio Interface (CPRI) Cooperation, Infiniband Trade Organization, RapidIO Trade Association, Small Form Factor (SFF) Committee, Ethernet Alliance, Video Electronics Standards Association (VESA), High-Definition Multimedia Interface (HDMI) Licensing LLC, HyperTransport Consortium, InfiniB and Trade Association, International Electrotechnical Commission (IEC), and Universal Serial Bus (USB) Implementer's Forum (USB-IF).

In certain implementations, receiving the set of measurement-based data comprises receiving at least one of the following sets of data, wherein each set of data is not derived from the plurality of samples: a root mean square (RMS) value; a standard deviation value; a variance value; at least one jitter value; at least one bit-error ratio (BER) value; and at least one Q-scale function value. In certain implementations, receiving the set of measurement-based data comprises receiving one of phase-noise data and spectral-power data, wherein the phase-noise data and the spectral-power data are not derived from the plurality of samples. In certain implementations, deriving the time-domain histogram of DJ comprises deriving the time-domain histogram of DJ from a plurality of the samples associated with clock timing signal edges having one slope direction and none of the samples associated with clock timing signal edges having a second slope direction. In certain implementations, the measure of jitter comprises a first value of jitter, and the method further involves: obtaining a second value of jitter; and generating at least one of the following based on the first value of jitter and the second value of jitter: a magnitude comparison indicator indicating a relative magnitude of the first value of jitter to the second value of jitter; a magnitude comparison indicator indicating a relative magnitude of the second value of jitter to the first value of jitter; a margin comparison indicator indicating relative margin between the first value of jitter and the second value of jitter; a margin comparison indicator indicating relative margin between the second value of jitter and the first value of jitter; a pass/fail indicator indicating whether the first value of jitter is one of larger and smaller than the second value of jitter; a result based on a computation of an equation including the first value of jitter and the second value of jitter; and a representation derived from the first value of jitter and the second value of jitter.

In certain implementations, the second value of jitter is derived from a quantity of jitter documented in a standard as a specification for jitter. In certain implementations, the standard comprises a standard that is administered, written, maintained, or provided by at least one organization selected from the group consisting of: Society of Motion Picture Television Engineers (SMPTE), Institute of Electrical and Electronics Engineers (IEEE), Peripheral Component Interconnect Special Interest Group (PCI-SIG), Telcordia Technologies Inc., American National Standards Institute (ANSI), International Telecommunication Union (ITU), Optical Internetworking Forum (OIF), Serial Advanced Technology Attachment International Organization (SATA-IO), International Committee for Information Technology Standards (INCITS), Common Public Radio Interface (CPRI) Cooperation, Infiniband Trade Organization, RapidIO Trade Association, Small Form Factor (SFF) Committee, Ethernet Alliance, Video Electronics Standards Association (VESA), High-Definition Multimedia Interface (HDMI) Licensing LLC, HyperTransport Consortium, InfiniB and Trade Association, International Electrotechnical Commission (IEC), and Universal Serial Bus (USB) Implementer's Forum (USB-IF). In certain implementations, the one slope direction is a rising direction, the second slope direction is a falling direction, and deriving the time-domain histogram of DJ comprises deriving the time-domain histogram of DJ from a plurality of the samples associated with rising edges of the clock timing signal and none of the samples associated with falling edges of the clock timing signal. In certain implementations, the one slope direction is a falling direction, the second slope direction is a rising direction, and deriving the time-domain histogram of DJ comprises deriving the time-domain histogram of DJ from a plurality of the samples associated with falling edges of the clock timing signal and none of the samples associated with rising edges of the clock timing signal. In certain implementations, receiving the set of measurement-based data comprises receiving the phase-noise data, wherein the phase-noise data is derived from the clock timing signal using a phase-noise analyzer. In certain implementations, receiving the set of measurement-based data comprises receiving the spectral-power data, wherein the spectral-power data is derived from the clock timing signal using a spectrum analyzer based on superheterodyne technology. In certain implementations, the plurality of samples is derived from a real-time sampling oscilloscope. In certain implementations, receiving the set of measurement-based data comprises receiving the phase-noise data; and deriving the time-domain histogram of RJ involves: deriving a root mean square (RMS) value of RJ from the phase-noise data and a first jitter filter; and deriving the time-domain histogram of RJ from a Gaussian model with a standard deviation equal to the RMS value of RJ.

In certain implementations, deriving the time-domain histogram of DJ involves deriving the time-domain histogram of DJ from a second jitter filter and a plurality of the samples associated with clock timing signal edges having one slope direction and none of the samples associated with clock timing signal edges having a second slope direction. In certain implementations, deriving the RMS value of RJ involves deriving the RMS value of RJ from the first jitter filter and an average of at least two phase-noise spectrums, wherein each phase-noise spectrum is derived from the clock timing signal. In certain implementations, deriving the time-domain histogram of DJ involves: deriving a time-interval error (TIE) jitter spectrum from a plurality of the samples associated with clock timing signal edges having one slope direction and none of the samples associated with clock timing signal edges having a second slope direction; identifying one or more impulses in the TIE jitter spectrum; determining the time-domain histogram of DJ based on a calculation resulting in applying an inverse-discrete Fourier transform to a spectrum derived from the second jitter filter and the one or more impulses.

In certain implementations, the measure of jitter comprises a first value of jitter, and the method further involves: obtaining a second value of jitter; and generating at least one of the following based on the first value of jitter and the second value of jitter: a magnitude comparison indicator indicating a relative magnitude of the first value of jitter to the second value of jitter; a magnitude comparison indicator indicating a relative magnitude of the second value of jitter to the first value of jitter; a margin comparison indicator indicating relative margin between the first value of jitter and the second value of jitter; a margin comparison indicator indicating relative margin between the second value of jitter and the first value of jitter; a pass/fail indicator indicating whether the first value of jitter is one of larger and smaller than the second value of jitter; a result based on a computation of an equation including the first value of jitter and the second value of jitter; and a representation derived from the first value of jitter and the second value of jitter.

In certain implementations, the second value of jitter is derived from a quantity of jitter documented in a standard as a specification for jitter. In certain implementations, the standard comprises a standard that is administered, written, maintained, or provided by at least one organization selected from the group consisting of: Society of Motion Picture Television Engineers (SMPTE), Institute of Electrical and Electronics Engineers (IEEE), Peripheral Component Interconnect Special Interest Group (PCI-SIG), Telcordia Technologies Inc., American National Standards Institute (ANSI), International Telecommunication Union (ITU), Optical Internetworking Forum (OIF), Serial Advanced Technology Attachment International Organization (SATA-IO), International Committee for Information Technology Standards (INCITS), Common Public Radio Interface (CPRI) Cooperation, Infiniband Trade Organization, RapidIO Trade Association, Small Form Factor (SFF) Committee, Ethernet Alliance, Video Electronics Standards Association (VESA), High-Definition Multimedia Interface (HDMI) Licensing LLC, HyperTransport Consortium, InfiniBand Trade Association, International Electrotechnical Commission (IEC), and Universal Serial Bus (USB) Implementer's Forum (USB-IF).

In certain implementations, the one slope direction is a rising direction, the second slope direction is a falling direction, and deriving the TIE jitter spectrum comprises deriving the TIE jitter spectrum from a plurality of the samples associated with rising edges of the clock timing signal and none of the samples associated with falling edges of the clock timing signal. In certain implementations, the one slope direction is a falling direction, the second slope direction is a rising direction, and deriving the TIE jitter spectrum comprises deriving the TIE jitter spectrum from a plurality of the samples associated with falling edges of the clock timing signal and none of the samples associated with rising edges of the clock timing signal. In certain implementations, the phase-noise data is derived from a phase-noise analyzer. In certain implementations, the plurality of samples is derived from a real-time sampling oscilloscope. In certain implementations, deriving the time-domain histogram of DJ involves: deriving more than one time-interval error (TIE) jitter spectrum from the plurality of samples, wherein each TIE jitter spectrum is derived from a plurality of the samples associated with clock timing signal edges having one slope direction and none of the samples associated with clock timing signal edges having a second slope direction; deriving an average TIE jitter spectrum from at least two of the TIE jitter spectrums, wherein the TIE jitter spectrums used to derive the average TIE jitter spectrum are all associated with a common slope direction; and deriving a time-domain histogram of DJ from the average TIE jitter spectrum.

In certain implementations, the measure of jitter comprises a first value of jitter, and the method further involves: obtaining a second value of jitter; and generating at least one of the following based on the first value of jitter and the second value of jitter: a magnitude comparison indicator indicating a relative magnitude of the first value of jitter to the second value of jitter; a magnitude comparison indicator indicating a relative magnitude of the second value of jitter to the first value of jitter; a margin comparison indicator indicating relative margin between the first value of jitter and the second value of jitter; a margin comparison indicator indicating relative margin between the second value of jitter and the first value of jitter; a pass/fail indicator indicating whether the first value of jitter is one of larger and smaller than the second value of jitter; a result based on a computation of an equation including the first value of jitter and the second value of jitter; and a representation derived from the first value of jitter and the second value of jitter. In certain implementations, the second value of jitter is derived from a quantity of jitter documented in a standard as a specification for jitter. In certain implementations, receiving the set of measurement-based data comprises receiving the spectral-power data; and deriving the time-domain histogram of RJ involves: deriving a root mean square (RMS) value of RJ from the spectral-power data and a first jitter filter; and deriving the time-domain histogram of RJ from a Gaussian model with a standard deviation equal to the RMS value of RJ. In certain implementations, deriving the time-domain histogram of DJ comprises deriving the time-domain histogram of DJ from a second jitter filter and a plurality of the samples associated with clock timing signal edges having one slope direction and none of the samples associated with clock timing signal edges having a second slope direction;

In certain implementations, deriving the RMS value of RJ comprises deriving the RMS value of RJ from the first jitter filter and an average of at least two sets of spectral-power data, wherein each set of spectral-power data is derived from the clock timing signal. In certain implementations, deriving the time-domain histogram of DJ involves: deriving a time-interval error (TIE) jitter spectrum from a plurality of the samples associated with clock timing signal edges having one slope direction and none of the samples associated with clock timing signal edges having a second slope direction; identifying one or more impulses in the TIE jitter spectrum; determining the time-domain histogram of DJ based on a calculation resulting in applying an inverse-discrete Fourier transform to a spectrum derived from the second jitter filter and the one or more impulses.

In certain implementations, the measure of jitter comprises a first value of jitter, and the method further involves: obtaining a second value of jitter; and generating at least one of the following based on the first value of jitter and the second value of jitter: a magnitude comparison indicator indicating a relative magnitude of the first value of jitter to the second value of jitter; a magnitude comparison indicator indicating a relative magnitude of the second value of jitter to the first value of jitter; a margin comparison indicator indicating relative margin between the first value of jitter and the second value of jitter; a margin comparison indicator indicating relative margin between the second value of jitter and the first value of jitter; a pass/fail indicator indicating whether the first value of jitter is one of larger and smaller than the second value of jitter; a result based on a computation of an equation including the first value of jitter and the second value of jitter; and a representation derived from the first value of jitter and the second value of jitter. In certain implementations, the second value of jitter is derived from a quantity of jitter documented in a standard as a specification for jitter. In certain implementations, the standard comprises a standard that is administered, written, maintained, or provided by at least one organization selected from the group consisting of: Society of Motion Picture Television Engineers (SMPTE), Institute of Electrical and Electronics Engineers (IEEE), Peripheral Component Interconnect Special Interest Group (PCI-SIG), Telcordia Technologies Inc., American National Standards Institute (ANSI), International Telecommunication Union (ITU), Optical Internetworking Forum (OIF), Serial Advanced Technology Attachment International Organization (SATA-IO), International Committee for Information Technology Standards (INCITS), Common Public Radio Interface (CPRI) Cooperation, Infiniband Trade Organization, RapidIO Trade Association, Small Form Factor (SFF) Committee, Ethernet Alliance, Video Electronics Standards Association (VESA), High-Definition Multimedia Interface (HDMI) Licensing LLC, HyperTransport Consortium, InfiniB and Trade Association, International Electrotechnical Commission (IEC), and Universal Serial Bus (USB) Implementer's Forum (USB-IF).

In certain implementations, the one slope direction is a rising direction, the second slope direction is a falling direction, and deriving the TIE jitter spectrum comprises deriving the TIE jitter spectrum from a plurality of the samples associated with rising edges of the clock timing signal and none of the samples associated with falling edges of the clock timing signal. In certain implementations, the one slope direction is a falling direction, the second slope direction is a rising direction, and deriving the TIE jitter spectrum comprises deriving the TIE jitter spectrum from a plurality of the samples associated with falling edges of the clock timing signal and none of the samples associated with rising edges of the clock timing signal. In certain implementations, the spectral-power data is derived from a spectrum analyzer based on superheterodyne technology. In certain implementations, the plurality of samples is derived from a real-time sampling oscilloscope. In certain implementations, deriving the time-domain histogram of DJ involves: deriving more than one time-interval error (TIE) jitter spectrum from the plurality of samples, wherein each TIE jitter spectrum is derived from a plurality of the samples associated with clock timing signal edges having one slope direction and none of the samples associated with clock timing signal edges having a second slope direction; deriving an average TIE jitter spectrum from at least two of the TIE jitter spectrums, wherein the TIE jitter spectrums used to derive the average TIE jitter spectrum are all associated with a common slope direction; and deriving a time-domain histogram of DJ from the average TIE jitter spectrum.

In certain implementations, the measure of jitter comprises a first value of jitter, and the method further involves: obtaining a second value of jitter; and generating at least one of the following based on the first value of jitter and the second value of jitter: a magnitude comparison indicator indicating a relative magnitude of the first value of jitter to the second value of jitter; a magnitude comparison indicator indicating a relative magnitude of the second value of jitter to the first value of jitter; a margin comparison indicator indicating relative margin between the first value of jitter and the second value of jitter; a margin comparison indicator indicating relative margin between the second value of jitter and the first value of jitter; a pass/fail indicator indicating whether the first value of jitter is one of larger and smaller than the second value of jitter; a result based on a computation of an equation including the first value of jitter and the second value of jitter; and a representation derived from the first value of jitter and the second value of jitter.

In certain implementations, the second value of jitter is derived from a quantity of jitter documented in a standard as a specification for jitter.

In certain implementations, one or more tangible non-transitory computer-readable storage devices contains programming instructions that when carried out on one or more programmed processors carry out a process, wherein the programming instructions comprise: instructions for receiving a plurality of samples obtained at a plurality of sample times, each sample representing an amplitude of a clock timing signal at a corresponding sample time, wherein the clock timing signal has edges with rising and falling slope directions; instructions for deriving a time-domain histogram of deterministic jitter (DJ) from a plurality of the samples; instructions for receiving a set of measurement-based data that is not derived from the plurality of samples; instructions for deriving a time-domain histogram of random jitter (RJ) from the set of measurement-based data; and instructions for determining a measure of jitter based on a calculation resulting in a convolution of the time-domain histogram of DJ and the time-domain histogram of RJ.

In certain implementations, the programming instructions are carried out on one or more processors forming a part of a real-time sampling oscilloscope. In certain implementations, the instructions for deriving the time-domain histogram of DJ comprise instructions for deriving the time-domain histogram of DJ from a plurality of the samples associated with clock timing signal edges having one slope direction and none of the samples associated with clock timing signal edges having a second slope direction. In certain implementations, the measure of jitter comprise a first value of jitter, and the instructions further involve: instructions for obtaining a second value of jitter; and instructions for generating at least one of the following based on the first value of jitter and the second value of jitter: a magnitude comparison indicator indicating a relative magnitude of the first value of jitter to the second value of jitter; a magnitude comparison indicator indicating a relative magnitude of the second value of jitter to the first value of jitter; a margin comparison indicator indicating relative margin between the first value of jitter and the second value of jitter; a margin comparison indicator indicating relative margin between the second value of jitter and the first value of jitter; a pass/fail indicator indicating whether the first value of jitter is one of larger and smaller than the second value of jitter; a result based on a computation of an equation including the first value of jitter and the second value of jitter; and a representation derived from the first value of jitter and the second value of jitter.

In certain implementations, the second value of jitter is derived from a quantity of jitter documented in a standard as a specification for jitter. In certain implementations, the standard comprises a standard that is administered, written, maintained, or provided by at least one organization selected from the group consisting of: Society of Motion Picture Television Engineers (SMPTE), Institute of Electrical and Electronics Engineers (IEEE), Peripheral Component Interconnect Special Interest Group (PCI-SIG), Telcordia Technologies Inc., American National Standards Institute (ANSI), International Telecommunication Union (ITU), Optical Internetworking Forum (OIF), Serial Advanced Technology Attachment International Organization (SATA-IO), International Committee for Information Technology Standards (INCITS), Common Public Radio Interface (CPRI) Cooperation, Infiniband Trade Organization, RapidIO Trade Association, Small Form Factor (SFF) Committee, Ethernet Alliance, Video Electronics Standards Association (VESA), High-Definition Multimedia Interface (HDMI) Licensing LLC, HyperTransport Consortium, InfiniB and Trade Association, International Electrotechnical Commission (IEC), and Universal Serial Bus (USB) Implementer's Forum (USB-IF).

In certain implementations of, the one or more computer-readable storage devices the instructions for receiving the set of measurement-based data comprise instructions for receiving at least one of the following sets of data not derived from the plurality of samples: a root mean square (RMS) value; a standard deviation value; a variance value; at least one jitter value; at least one bit-error ratio (BER) value; and at least one Q-scale function value. In certain implementations, the programming instructions are carried out on one or more processors forming a part of a real-time sampling oscilloscope. In certain implementations, the instructions for receiving the set of measurement-based data comprise instructions for receiving phase-noise data, wherein the phase-noise data is not derived from the plurality of samples; and the instructions for deriving the time-domain histogram of RJ comprise: instructions for deriving a root mean square (RMS) value of RJ from a first jitter filter and the phase-noise data; and instructions for deriving the time-domain histogram of RJ from a Gaussian model with a standard deviation equal to the RMS value of RJ. In certain implementations, the instructions for deriving the time-domain histogram of DJ comprise: instructions for deriving a time-interval error (TIE) jitter spectrum from a plurality of the samples associated with clock timing signal edges having one slope direction and none of the samples associated with clock timing signal edges having a second slope direction; instructions for identifying one or more impulses in the TIE jitter spectrum; instructions for determining the time-domain histogram of DJ based on a calculation resulting in applying an inverse-discrete Fourier transform to a spectrum derived from a second jitter filter and the one or more impulses.

In certain implementations of the one or more computer-readable storage devices, the measure of jitter comprises a first value of jitter, and the instructions further comprise: instructions for obtaining a second value of jitter; and instructions for generating at least one of the following based on the first value of jitter and the second value of jitter: a magnitude comparison indicator indicating a relative magnitude of the first value of jitter to the second value of jitter; a magnitude comparison indicator indicating a relative magnitude of the second value of jitter to the first value of jitter; a margin comparison indicator indicating relative margin between the first value of jitter and the second value of jitter; a margin comparison indicator indicating relative margin between the second value of jitter and the first value of jitter; a pass/fail indicator indicating whether the first value of jitter is one of larger and smaller than the second value of jitter; a result based on a computation of an equation including the first value of jitter and the second value of jitter; and a representation derived from the first value of jitter and the second value of jitter.

In certain implementations of the one or more computer-readable storage devices the second value of jitter is derived from a quantity of jitter documented in a standard as a specification for jitter. In certain implementations, the instructions for receiving the set of measurement-based data comprise instructions for receiving spectral-power data, wherein the spectral-power data is not derived from the plurality of samples; and the instructions for deriving the time-domain histogram of RJ comprise: instructions for deriving a root mean square (RMS) value of RJ from a first jitter filter and the spectral-power data; and instructions for deriving the time-domain histogram of RJ from a Gaussian model with a standard deviation equal to the RMS value of RJ. In certain implementations, the instructions for deriving the time-domain histogram of DJ comprise: instructions for deriving a time-interval error (TIE) jitter spectrum from a plurality of the samples associated with clock timing signal edges having one slope direction and none of the samples associated with clock timing signal edges having a second slope direction; instructions for identifying one or more impulses in the TIE jitter spectrum; instructions for determining the time-domain histogram of DJ based on a calculation resulting in applying an inverse-discrete Fourier transform to a spectrum derived from a second jitter filter and the one or more impulses. In certain implementations, the measure of jitter comprises a first value of jitter, and the instructions further comprise: instructions for obtaining a second value of jitter; and instructions for generating at least one of the following based on the first value of jitter and the second value of jitter: a magnitude comparison indicator indicating a relative magnitude of the first value of jitter to the second value of jitter; a magnitude comparison indicator indicating a relative magnitude of the second value of jitter to the first value of jitter; a margin comparison indicator indicating relative margin between the first value of jitter and the second value of jitter; a margin comparison indicator indicating relative margin between the second value of jitter and the first value of jitter; a pass/fail indicator indicating whether the first value of jitter is one of larger and smaller than the second value of jitter; a result based on a computation of an equation including the first value of jitter and the second value of jitter; and a representation derived from the first value of jitter and the second value of jitter. In certain implementations of, the one or more computer-readable storage devices the second value of jitter is derived from a quantity of jitter documented in a standard as a specification for jitter.

In accord with certain implementations, an apparatus consistent with certain implementations has an input unit comprising at least one input that receives a clock timing signal, wherein the clock timing signal has edges with rising and falling slope directions. A signal analyzer receives a first test signal from the input unit that measures a set of characteristic data derived from the first test signal, wherein the first test signal is derived from the clock timing signal. A clock sampling unit receives a second test signal from the input unit that samples the second test signal to obtain a plurality of samples, each sample representing an amplitude of the second test signal at a corresponding sample time, wherein the second test signal is derived from the clock timing signal. At least one memory is connected to the at least one processing unit with sufficient storage for retaining at least the set of characteristic data and the plurality of samples. The at least one processing unit operates to compute the following: a time-domain histogram of random jitter derived from the set of characteristic data; a time-domain histogram of deterministic jitter derived from a plurality of the samples; a measure of jitter based on a calculation resulting in a convolution of the time-domain histogram of deterministic jitter and the time-domain histogram of random jitter.

In certain implementations, the signal analyzer comprises a spectrum analyzer based on superheterodyne technology, and wherein the set of characteristic data measured by the spectrum analyzer corresponds to the spectral-power data. In certain implementations, the signal analyzer comprises a phase-noise analyzer, and wherein the set of characteristic data measured by the phase-noise analyzer corresponds to the phase-noise data. In certain implementations, the at least one processing unit is connected to the memory and computes at least one jitter filter, and uses the at least one jitter filter to compute at least one of: the time-domain histogram of random jitter, and the time-domain histogram of deterministic jitter. In certain implementations, the at least one processing unit connected to the memory computes at least one jitter filter, and uses the at least one jitter filter to compute at least one of: the time-domain histogram of random jitter, and the time-domain histogram of deterministic jitter.

Those of skilled in the art will recognize upon consideration of the present teachings that one or more of the example embodiments can be accomplished using any form of storage or computer-readable medium, including but not limited to distribution media, intermediate storage media, execution memory of a computer, computer-readable storage device, and any other medium or device or non-transitory storage capable of storing for later reading by a computer program implementing one or more embodiments. Those of ordinary skill in the art will appreciate that the methods described above can be implemented in any number of variations, including adding or deleting certain actions, without departing from the scope of one or more of the embodiments.

Those of skilled in the art will recognize upon consideration of the present teachings that the methods and associated data used to implement one or more embodiments can be implemented using disc storage or other forms of storage, including but not limited to Read Only Memory (ROM) devices, Random Access Memory (RAM) devices, optical storage elements, magnetic storage elements, magneto-optical storage elements, flash memory, core memory and/or other equivalent storage technologies.

Applications of one or more implementations are envisioned, including one in which the embodiment includes a personal computer connected to one or more measurement technologies, such as the real-time sampling oscilloscope, the spectrum analyzer based on superheterodyne technology, and/or the phase-noise analyzer. One or more embodiments may also be implemented within a test instrument or within the measurement technology, such as one of the real-time sampling oscilloscope, spectrum analyzer based on superheterodyne technology, and the phase-noise analyzer. Special-purpose hardware dedicated to performing the functions described herein may also be implemented. Further implementations include software residing on a general-purpose computer, or a standalone computer that receives files or other data, and provides off-line analysis.

Those of ordinary skill in the art will recognize that one or more embodiments may be implemented using hardware components such as special-purpose hardware and/or dedicated processors, which are within the scope and spirit of the above description and in the appended claims. Similarly, custom circuits, microprocessors, general purpose computers, microprocessor based computers, microcontrollers, ASICs, and/or other dedicated hard wired logic may be used to construct alternative equivalent embodiments. Hence, the term "one or more programmed processors" should be interpreted to mean a device that is programmed or designed as a dedicated hardware device to carry out a programmed function.

Since certain changes may be made in the foregoing disclosure without departing from the scope of the embodiments herein involved, it is intended that all matter contained in the above description and depicted in the accompanying drawings be construed in an illustrative and not in a limiting sense.

While the above description contains many specificities, these should not be construed as limitations on the scope, but rather as an exemplification of one or more preferred embodiments thereof. Many other variations are possible. Accordingly, the scope should be determined not by the embodiments illustrated, but by the appended claims and their legal equivalents.

Certain embodiments may be implemented using a programmed processor executing programming instructions that in certain instances are broadly described above in flow chart form that can be stored on any suitable electronic or computer readable storage medium (such as, for example, disc storage, Read Only Memory (ROM) devices, Random Access Memory (RAM) devices, network memory devices, optical storage elements, magnetic storage elements, magneto-optical storage elements, flash memory, core memory and/or other equivalent volatile and non-volatile storage technologies). However, those skilled in the art will appreciate, upon consideration of the present teaching, that the processes described above can be implemented in any number of variations and in many suitable programming languages without departing from embodiments of the present invention. For example, the order of certain operations carried out can often be varied, additional operations can be added or operations can be deleted without departing from certain embodiments of the invention. Error trapping can be added and/or enhanced and variations can be made in user interface and information presentation without departing from certain embodiments of the present invention. Such variations are contemplated and considered equivalent.

While certain illustrative embodiments have been described, it is evident that many alternatives, modifications, permutations and variations will become apparent to those skilled in the art in light of the foregoing description.

What is claimed is:

1. A method, comprising:
    at a clock sampler, converting a clock timing signal derived from a clock timing source into a plurality of samples obtained at a plurality of sample times, each sample representing an amplitude of the clock timing signal at a corresponding sample time, wherein the clock timing signal has edges with rising and falling slope directions;
    deriving a time-domain histogram of deterministic jitter (DJ) from a plurality of the samples;
    receiving a set of measurement-based data that is not derived from the plurality of samples;
    deriving a time-domain histogram of random jitter (RJ) from the set of measurement-based data; and
    determining a measure of jitter based on a calculation resulting in a convolution of the time-domain histogram of DJ and the time-domain histogram of RJ.

2. The method of claim 1, wherein the plurality of samples is derived from a first source of data that comprises a real-time sampling oscilloscope, and the set of measurement-based data is derived from a second source of data that is different from the first source of data.

3. The method of claim 1, wherein the measure of jitter comprises a first value of jitter, and the method further comprising:
    obtaining a second value of jitter; and
    generating at least one of the following based on the first value of jitter and the second value of jitter:
        a magnitude comparison indicator indicating a relative magnitude of the first value of jitter to the second value of jitter;
        a magnitude comparison indicator indicating a relative magnitude of the second value of jitter to the first value of jitter;
        a margin comparison indicator indicating relative margin between the first value of jitter and the second value of jitter;
        a margin comparison indicator indicating relative margin between the second value of jitter and the first value of jitter;
        a pass/fail indicator indicating whether the first value of jitter is one of larger and smaller than the second value of jitter;
        a result based on a computation of an equation including the first value of jitter and the second value of jitter; and
        a representation derived from the first value of jitter and the second value of jitter.

4. The method of claim 3, wherein the second value of jitter is derived from a quantity of jitter documented in a standard as a specification for jitter.

5. The method of claim 1, wherein deriving the time-domain histogram of DJ comprises deriving the time-domain histogram of DJ from a plurality of the samples associated with clock timing signal edges having one slope direction and none of the samples associated with clock timing signal edges having a second slope direction.

6. The method of claim 5, wherein the measure of jitter comprises a first value of jitter, and the method further comprising:
    obtaining a second value of jitter; and
    generating at least one of the following based on the first value of jitter and the second value of jitter:
        a magnitude comparison indicator indicating a relative magnitude of the first value of jitter to the second value of jitter;

a magnitude comparison indicator indicating a relative magnitude of the second value of jitter to the first value of jitter;

a margin comparison indicator indicating relative margin between the first value of jitter and the second value of jitter;

a margin comparison indicator indicating relative margin between the second value of jitter and the first value of jitter;

a pass/fail indicator indicating whether the first value of jitter is one of larger and smaller than the second value of jitter;

a result based on a computation of an equation including the first value of jitter and the second value of jitter; and a representation derived from the first value of jitter and the second value of jitter.

7. The method of claim 6, wherein the second value of jitter is derived from a quantity of jitter documented in a standard as a specification for jitter.

8. The method of claim 7, wherein the standard comprises a standard that is administered, written, maintained, or provided by at least one organization selected from the group consisting of: Society of Motion Picture Television Engineers (SMPTE), Institute of Electrical and Electronics Engineers (IEEE), Peripheral Component Interconnect Special Interest Group (PCI-SIG), Telcordia Technologies Inc., American National Standards Institute (ANSI), International Telecommunication Union (ITU), Optical Internetworking Forum (OIF), Serial Advanced Technology Attachment International Organization (SATA-IO), International Committee for Information Technology Standards (INCITS), Common Public Radio Interface (CPRI) Cooperation, Infiniband Trade Organization, RapidIO Trade Association, Small Form Factor (SFF) Committee, Ethernet Alliance, Video Electronics Standards Association (VESA), High-Definition Multimedia Interface (HDMI) Licensing LLC, HyperTransport Consortium, InfiniBand Trade Association, International Electrotechnical Commission (IEC), and Universal Serial Bus (USB) Implementer's Forum (USB-IF).

9. The method of claim 7, wherein receiving the set of measurement-based data comprises receiving at least one of the following sets of data, wherein each set of data is not derived from the plurality of samples:

a root mean square (RMS) value;
a standard deviation value;
a variance value;
at least one jitter value;
at least one bit-error ratio (BER) value; and
at least one Q-scale function value.

10. The method of claim 1, wherein receiving the set of measurement-based data comprises receiving one of phase-noise data and spectral-power data, wherein the phase-noise data and the spectral-power data are not derived from the plurality of samples.

11. The method of claim 10, wherein deriving the time-domain histogram of DJ comprises deriving the time-domain histogram of DJ from a plurality of the samples associated with clock timing signal edges having one slope direction and none of the samples associated with clock timing signal edges having a second slope direction.

12. The method of claim 11, wherein the measure of jitter comprises a first value of jitter, and the method further comprising:

obtaining a second value of jitter; and
generating at least one of the following based on the first value of jitter and the second value of jitter:

a magnitude comparison indicator indicating a relative magnitude of the first value of jitter to the second value of jitter;

a magnitude comparison indicator indicating a relative magnitude of the second value of jitter to the first value of jitter;

a margin comparison indicator indicating relative margin between the first value of jitter and the second value of jitter;

a margin comparison indicator indicating relative margin between the second value of jitter and the first value of jitter;

a pass/fail indicator indicating whether the first value of jitter is one of larger and smaller than the second value of jitter;

a result based on a computation of an equation including the first value of jitter and the second value of jitter; and a representation derived from the first value of jitter and the second value of jitter.

13. The method of claim 12, wherein the second value of jitter is derived from a quantity of jitter documented in a standard as a specification for jitter.

14. The method of claim 13, wherein the standard comprises a standard that is administered, written, maintained, or provided by at least one organization selected from the group consisting of: Society of Motion Picture Television Engineers (SMPTE), Institute of Electrical and Electronics Engineers (IEEE), Peripheral Component Interconnect Special Interest Group (PCI-SIG), Telcordia Technologies Inc., American National Standards Institute (ANSI), International Telecommunication Union (ITU), Optical Internetworking Forum (OIF), Serial Advanced Technology Attachment International Organization (SATA-IO), International Committee for Information Technology Standards (INCITS), Common Public Radio Interface (CPRI) Cooperation, Infiniband Trade Organization, RapidIO Trade Association, Small Form Factor (SFF) Committee, Ethernet Alliance, Video Electronics Standards Association (VESA), High-Definition Multimedia Interface (HDMI) Licensing LLC, HyperTransport Consortium, InfiniBand Trade Association, International Electrotechnical Commission (IEC), and Universal Serial Bus (USB) Implementer's Forum (USB-IF).

15. The method of claim 13, wherein the one slope direction is a rising direction, the second slope direction is a falling direction, and deriving the time-domain histogram of DJ comprises deriving the time-domain histogram of DJ from a plurality of the samples associated with rising edges of the clock timing signal and none of the samples associated with falling edges of the clock timing signal.

16. The method of claim 13, wherein the one slope direction is a falling direction, the second slope direction is a rising direction, and deriving the time-domain histogram of DJ comprises deriving the time-domain histogram of DJ from a plurality of the samples associated with falling edges of the clock timing signal and none of the samples associated with rising edges of the clock timing signal.

17. The method of claim 13, wherein receiving the set of measurement-based data comprises receiving the phase-noise data, wherein the phase-noise data is derived from the clock timing signal using a phase-noise analyzer.

18. The method of claim 13, wherein receiving the set of measurement-based data comprises receiving the spectral-power data, wherein the spectral-power data is derived from the clock timing signal using a spectrum analyzer based on superheterodyne technology.

19. The method of claim 13, wherein the plurality of samples is derived from a real-time sampling oscilloscope.

20. The method of claim 10, wherein receiving the set of measurement-based data comprises receiving the phase-noise data; and deriving the time-domain histogram of RJ comprises:
- deriving a root mean square (RMS) value of RJ from the phase-noise data and a first jitter filter; and
- deriving the time-domain histogram of RJ from a Gaussian model with a standard deviation equal to the RMS value of RJ.

21. The method of claim 20, wherein deriving the time-domain histogram of DJ comprises deriving the time-domain histogram of DJ from a second jitter filter and a plurality of the samples associated with clock timing signal edges having one slope direction and none of the samples associated with clock timing signal edges having a second slope direction.

22. The method of claim 21 wherein deriving the RMS value of RJ comprises deriving the RMS value of RJ from the first jitter filter and an average of at least two phase-noise spectrums, wherein each phase-noise spectrum is derived from the clock timing signal.

23. The method of claim 21, wherein deriving the time-domain histogram of DJ comprises:
- deriving a time-interval error (TIE) jitter spectrum from a plurality of the samples associated with clock timing signal edges having one slope direction and none of the samples associated with clock timing signal edges having a second slope direction;
- identifying one or more impulses in the TIE jitter spectrum;
- determining the time-domain histogram of DJ based on a calculation resulting in applying an inverse-discrete Fourier transform to a spectrum derived from the second jitter filter and the one or more impulses.

24. The method of claim 23, wherein the measure of jitter comprises a first value of jitter, and the method further comprising:
- obtaining a second value of jitter; and
generating at least one of the following based on the first value of jitter and the second value of jitter:
- a magnitude comparison indicator indicating a relative magnitude of the first value of jitter to the second value of jitter;
- a magnitude comparison indicator indicating a relative magnitude of the second value of jitter to the first value of jitter;
- a margin comparison indicator indicating relative margin between the first value of jitter and the second value of jitter;
- a margin comparison indicator indicating relative margin between the second value of jitter and the first value of jitter;
- a pass/fail indicator indicating whether the first value of jitter is one of larger and smaller than the second value of jitter;
- a result based on a computation of an equation including the first value of jitter and the second value of jitter; and
- a representation derived from the first value of jitter and the second value of jitter.

25. The method of claim 24, wherein the second value of jitter is derived from a quantity of jitter documented in a standard as a specification for jitter.

26. The method of claim 25, wherein the standard comprises a standard that is administered, written, maintained, or provided by at least one organization selected from the group consisting of: Society of Motion Picture Television Engineers (SMPTE), Institute of Electrical and Electronics Engineers (IEEE), Peripheral Component Interconnect Special Interest Group (PCI-SIG), Telcordia Technologies Inc., American National Standards Institute (ANSI), International Telecommunication Union (ITU), Optical Internetworking Forum (OIF), Serial Advanced Technology Attachment International Organization (SATA-IO), International Committee for Information Technology Standards (INCITS), Common Public Radio Interface (CPRI) Cooperation, Infiniband Trade Organization, RapidIO Trade Association, Small Form Factor (SFF) Committee, Ethernet Alliance, Video Electronics Standards Association (VESA), High-Definition Multimedia Interface (HDMI) Licensing LLC, HyperTransport Consortium, InfiniBand Trade Association, International Electrotechnical Commission (IEC), and Universal Serial Bus (USB) Implementer's Forum (USB-IF).

27. The method of claim 25, wherein the one slope direction is a rising direction, the second slope direction is a falling direction, and deriving the TIE jitter spectrum comprises deriving the TIE jitter spectrum from a plurality of the samples associated with rising edges of the clock timing signal and none of the samples associated with falling edges of the clock timing signal.

28. The method of claim 25, wherein the one slope direction is a falling direction, the second slope direction is a rising direction, and deriving the TIE jitter spectrum comprises deriving the TIE jitter spectrum from a plurality of the samples associated with falling edges of the clock timing signal and none of the samples associated with rising edges of the clock timing signal.

29. The method of claim 25, wherein the phase-noise data is derived from a phase-noise analyzer.

30. The method of claim 29, wherein the plurality of samples is derived from a real-time sampling oscilloscope.

31. The method of claim 20, wherein deriving the time-domain histogram of DJ comprises:
- deriving more than one time-interval error (TIE) jitter spectrum from the plurality of samples, wherein each TIE jitter spectrum is derived from a plurality of the samples associated with clock timing signal edges having one slope direction and none of the samples associated with clock timing signal edges having a second slope direction;
- deriving an average TIE jitter spectrum from at least two of the TIE jitter spectrums, wherein the TIE jitter spectrums used to derive the average TIE jitter spectrum are all associated with a common slope direction; and
- deriving a time-domain histogram of DJ from the average TIE jitter spectrum.

32. The method of claim 31, wherein the measure of jitter comprises a first value of jitter, and the method further comprising:
- obtaining a second value of jitter; and
generating at least one of the following based on the first value of jitter and the second value of jitter:
- a magnitude comparison indicator indicating a relative magnitude of the first value of jitter to the second value of jitter;
- a magnitude comparison indicator indicating a relative magnitude of the second value of jitter to the first value of jitter;
- a margin comparison indicator indicating relative margin between the first value of jitter and the second value of jitter;
- a margin comparison indicator indicating relative margin between the second value of jitter and the first value of jitter;
- a pass/fail indicator indicating whether the first value of jitter is one of larger and smaller than the second value of jitter;

a result based on a computation of an equation including the first value of jitter and the second value of jitter; and a representation derived from the first value of jitter and the second value of jitter.

33. The method of claim 32, wherein the second value of jitter is derived from a quantity of jitter documented in a standard as a specification for jitter.

34. The method of claim 10, wherein receiving the set of measurement-based data comprises receiving the spectral-power data; and deriving the time-domain histogram of RJ comprises:

deriving a root mean square (RMS) value of RJ from the spectral-power data and a first jitter filter; and deriving the time-domain histogram of RJ from a Gaussian model with a standard deviation equal to the RMS value of RJ.

35. The method of claim 34, wherein deriving the time-domain histogram of DJ comprises deriving the time-domain histogram of DJ from a second jitter filter and a plurality of the samples associated with clock timing signal edges having one slope direction and none of the samples associated with clock timing signal edges having a second slope direction.

36. The method of claim 35, wherein deriving the RMS value of RJ comprises deriving the RMS value of RJ from the first jitter filter and an average of at least two sets of spectral-power data, wherein each set of spectral-power data is derived from the clock timing signal.

37. The method of claim 35, wherein deriving the time-domain histogram of DJ comprises:

deriving a time-interval error (TIE) jitter spectrum from a plurality of the samples associated with clock timing signal edges having one slope direction and none of the samples associated with clock timing signal edges having a second slope direction;

identifying one or more impulses in the TIE jitter spectrum;

determining the time-domain histogram of DJ based on a calculation resulting in applying an inverse-discrete Fourier transform to a spectrum derived from the second jitter filter and the one or more impulses.

38. The method of claim 37, wherein the measure of jitter comprises a first value of jitter, and the method further comprising:

obtaining a second value of jitter; and generating at least one of the following based on the first value of jitter and the second value of jitter:

a magnitude comparison indicator indicating a relative magnitude of the first value of jitter to the second value of jitter;

a magnitude comparison indicator indicating a relative magnitude of the second value of jitter to the first value of jitter;

a margin comparison indicator indicating relative margin between the first value of jitter and the second value of jitter;

a margin comparison indicator indicating relative margin between the second value of jitter and the first value of jitter;

a pass/fail indicator indicating whether the first value of jitter is one of larger and smaller than the second value of jitter;

a result based on a computation of an equation including the first value of jitter and the second value of jitter; and a representation derived from the first value of jitter and the second value of jitter.

39. The method of claim 38, wherein the second value of jitter is derived from a quantity of jitter documented in a standard as a specification for jitter.

40. The method of claim 39, wherein the standard comprises a standard that is administered, written, maintained, or provided by at least one organization selected from the group consisting of: Society of Motion Picture Television Engineers (SMPTE), Institute of Electrical and Electronics Engineers (IEEE), Peripheral Component Interconnect Special Interest Group (PCI-SIG), Telcordia Technologies Inc., American National Standards Institute (ANSI), International Telecommunication Union (ITU), Optical Internetworking Forum (OIF), Serial Advanced Technology Attachment International Organization (SATA-IO), International Committee for Information Technology Standards (INCITS), Common Public Radio Interface (CPRI) Cooperation, Infiniband Trade Organization, RapidIO Trade Association, Small Form Factor (SFF) Committee, Ethernet Alliance, Video Electronics Standards Association (VESA), High-Definition Multimedia Interface (HDMI) Licensing LLC, HyperTransport Consortium, InfiniBand Trade Association, International Electrotechnical Commission (IEC), and Universal Serial Bus (USB) Implementer's Forum (USB-IF).

41. The method of claim 39, wherein the one slope direction is a rising direction, the second slope direction is a falling direction, and deriving the TIE jitter spectrum comprises deriving the TIE jitter spectrum from a plurality of the samples associated with rising edges of the clock timing signal and none of the samples associated with falling edges of the clock timing signal.

42. The method of claim 39, wherein the one slope direction is a falling direction, the second slope direction is a rising direction, and deriving the TIE jitter spectrum comprises deriving the TIE jitter spectrum from a plurality of the samples associated with falling edges of the clock timing signal and none of the samples associated with rising edges of the clock timing signal.

43. The method of claim 39, wherein the spectral-power data is derived from a spectrum analyzer based on superheterodyne technology.

44. The method of claim 43, wherein the plurality of samples is derived from a real-time sampling oscilloscope.

45. The method of claim 34, wherein deriving the time-domain histogram of DJ comprises:

deriving more than one time-interval error (TIE) jitter spectrum from the plurality of samples, wherein each TIE jitter spectrum is derived from a plurality of the samples associated with clock timing signal edges having one slope direction and none of the samples associated with clock timing signal edges having a second slope direction;

deriving an average TIE jitter spectrum from at least two of the TIE jitter spectrums, wherein the TIE jitter spectrums used to derive the average TIE jitter spectrum are all associated with a common slope direction; and deriving a time-domain histogram of DJ from the average TIE jitter spectrum.

46. The method of claim 45, wherein the measure of jitter comprises a first value of jitter, and the method further comprising:

obtaining a second value of jitter; and generating at least one of the following based on the first value of jitter and the second value of jitter:

a magnitude comparison indicator indicating a relative magnitude of the first value of jitter to the second value of jitter;

a magnitude comparison indicator indicating a relative magnitude of the second value of jitter to the first value of jitter;

a margin comparison indicator indicating relative margin between the first value of jitter and the second value of jitter;

a margin comparison indicator indicating relative margin between the second value of jitter and the first value of jitter;
a pass/fail indicator indicating whether the first value of jitter is one of larger and smaller than the second value of jitter;
a result based on a computation of an equation including the first value of jitter and the second value of jitter; and
a representation derived from the first value of jitter and the second value of jitter.

47. The method of claim 46, wherein the second value of jitter is derived from a quantity of jitter documented in a standard as a specification for jitter.

48. One or more tangible non-transitory computer-readable storage devices containing programming instructions that when carried out on one or more programmed processors carry out a process, wherein the programming instructions comprise:
instructions for receiving a plurality of samples obtained at a plurality of sample times, each sample representing an amplitude of a clock timing signal at a corresponding sample time, wherein the clock timing signal has edges with rising and falling slope directions;
instructions for deriving a time-domain histogram of deterministic jitter (DJ) from a plurality of the samples;
instructions for receiving a set of measurement-based data that is not derived from the plurality of samples;
instructions for deriving a time-domain histogram of random jitter (RJ) from the set of measurement-based data; and
instructions for determining a measure of jitter based on a calculation resulting in a convolution of the time-domain histogram of DJ and the time-domain histogram of RJ.

49. The one or more computer-readable storage devices of claim 48, wherein the programming instructions are carried out on one or more processors forming a part of a real-time sampling oscilloscope.

50. The one or more computer-readable storage devices of claim 48, wherein the instructions for deriving the time-domain histogram of DJ comprise instructions for deriving the time-domain histogram of DJ from a plurality of the samples associated with clock timing signal edges having one slope direction and none of the samples associated with clock timing signal edges having a second slope direction.

51. The one or more computer-readable storage devices of claim 50, wherein the measure of jitter comprise a first value of jitter, and the instructions further comprise:
instructions for obtaining a second value of jitter; and
instructions for generating at least one of the following based on the first value of jitter and the second value of jitter:
a magnitude comparison indicator indicating a relative magnitude of the first value of jitter to the second value of jitter;
a magnitude comparison indicator indicating a relative magnitude of the second value of jitter to the first value of jitter;
a margin comparison indicator indicating relative margin between the first value of jitter and the second value of jitter;
a margin comparison indicator indicating relative margin between the second value of jitter and the first value of jitter;
a pass/fail indicator indicating whether the first value of jitter is one of larger and smaller than the second value of jitter;
a result based on a computation of an equation including the first value of jitter and the second value of jitter; and
a representation derived from the first value of jitter and the second value of jitter.

52. The one or more computer-readable storage devices of claim 51, wherein the second value of jitter is derived from a quantity of jitter documented in a standard as a specification for jitter.

53. The one or more computer-readable storage devices of claim 52, wherein the standard comprises a standard that is administered, written, maintained, or provided by at least one organization selected from the group consisting of: Society of Motion Picture Television Engineers (SMPTE), Institute of Electrical and Electronics Engineers (IEEE), Peripheral Component Interconnect Special Interest Group (PCI-SIG), Telcordia Technologies Inc., American National Standards Institute (ANSI), International Telecommunication Union (ITU), Optical Internetworking Forum (OIF), Serial Advanced Technology Attachment International Organization (SATA-IO), International Committee for Information Technology Standards (INCITS), Common Public Radio Interface (CPRI) Cooperation, Infiniband Trade Organization, RapidIO Trade Association, Small Form Factor (SFF) Committee, Ethernet Alliance, Video Electronics Standards Association (VESA), High-Definition Multimedia Interface (HDMI) Licensing LLC, HyperTransport Consortium, InfiniBand Trade Association, International Electrotechnical Commission (IEC), and Universal Serial Bus (USB) Implementer's Forum (USB-IF).

54. The one or more computer-readable storage devices of claim 52, wherein the instructions for receiving the set of measurement-based data comprise instructions for receiving at least one of the following sets of data not derived from the plurality of samples:
a root mean square (RMS) value;
a standard deviation value;
a variance value;
at least one jitter value;
at least one bit-error ratio (BER) value; and
at least one Q-scale function value.

55. The one or more computer-readable storage devices according to claim 52, where the programming instructions are carried out on one or more processors forming a part of a real-time sampling oscilloscope.

56. The one or more computer-readable storage devices of claim 50, wherein the instructions for receiving the set of measurement-based data comprise instructions for receiving phase-noise data, wherein the phase-noise data is not derived from the plurality of samples; and the instructions for deriving the time-domain histogram of RJ comprise:
instructions for deriving a root mean square (RMS) value of RJ from a first jitter filter and the phase-noise data; and
instructions for deriving the time-domain histogram of RJ from a Gaussian model with a standard deviation equal to the RMS value of RJ.

57. The one or more computer-readable storage devices of claim 56, wherein the instructions for deriving the time-domain histogram of DJ comprise:
instructions for deriving a time-interval error (TIE) jitter spectrum from a plurality of the samples associated with clock timing signal edges having one slope direction and none of the samples associated with clock timing signal edges having a second slope direction;
instructions for identifying one or more impulses in the TIE jitter spectrum;

instructions for determining the time-domain histogram of DJ based on a calculation resulting in applying an inverse-discrete Fourier transform to a spectrum derived from a second jitter filter and the one or more impulses.

58. The one or more computer-readable storage devices of claim 57, wherein the measure of jitter comprises a first value of jitter, and the instructions further comprise:
   instructions for obtaining a second value of jitter; and
      instructions for generating at least one of the following based on the first value of jitter and the second value of jitter:
      a magnitude comparison indicator indicating a relative magnitude of the first value of jitter to the second value of jitter;
      a magnitude comparison indicator indicating a relative magnitude of the second value of jitter to the first value of jitter;
      a margin comparison indicator indicating relative margin between the first value of jitter and the second value of jitter;
      a margin comparison indicator indicating relative margin between the second value of jitter and the first value of jitter;
      a pass/fail indicator indicating whether the first value of jitter is one of larger and smaller than the second value of jitter;
      a result based on a computation of an equation including the first value of jitter and the second value of jitter; and
   a representation derived from the first value of jitter and the second value of jitter.

59. The one or more computer-readable storage devices of claim 58, wherein the second value of jitter is derived from a quantity of jitter documented in a standard as a specification for jitter.

60. The one or more computer-readable storage devices of claim 50, wherein the instructions for receiving the set of measurement-based data comprise instructions for receiving spectral-power data, wherein the spectral-power data is not derived from the plurality of samples; and the instructions for deriving the time-domain histogram of RJ comprise:
   instructions for deriving a root mean square (RMS) value of RJ from a first jitter filter and the spectral-power data; and
   instructions for deriving the time-domain histogram of RJ from a Gaussian model with a standard deviation equal to the RMS value of RJ.

61. The one or more computer-readable storage devices of claim 60, wherein the instructions for deriving the time-domain histogram of DJ comprise:
   instructions for deriving a time-interval error (TIE) jitter spectrum from a plurality of the samples associated with clock timing signal edges having one slope direction and none of the samples associated with clock timing signal edges having a second slope direction;
   instructions for identifying one or more impulses in the TIE jitter spectrum;
   instructions for determining the time-domain histogram of DJ based on a calculation resulting in applying an inverse-discrete Fourier transform to a spectrum derived from a second jitter filter and the one or more impulses.

62. The one or more computer-readable storage devices of claim 61, wherein the measure of jitter comprises a first value of jitter, and the instructions further comprise:
   instructions for obtaining a second value of jitter; and
   instructions for generating at least one of the following based on the first value of jitter and the second value of jitter:
      a magnitude comparison indicator indicating a relative magnitude of the first value of jitter to the second value of jitter;
      a magnitude comparison indicator indicating a relative magnitude of the second value of jitter to the first value of jitter;
      a margin comparison indicator indicating relative margin between the first value of jitter and the second value of jitter;
      a margin comparison indicator indicating relative margin between the second value of jitter and the first value of jitter;
      a pass/fail indicator indicating whether the first value of jitter is one of larger and smaller than the second value of jitter;
      a result based on a computation of an equation including the first value of jitter and the second value of jitter; and
   a representation derived from the first value of jitter and the second value of jitter.

63. The one or more computer-readable storage devices of claim 62, wherein the second value of jitter is derived from a quantity of jitter documented in a standard as a specification for jitter.

64. An apparatus, comprising:
   a clock sampling unit that receives a clock timing signal and derives a plurality of samples, each sample representing an amplitude of the clock timing signal at a corresponding sample time;
   a signal analyzer receiving a set of characteristic data not derived from the plurality of samples;
   at least one memory connected to the at least one processing unit with sufficient storage for retaining at least the set of characteristic data and the plurality of samples;
   the at least one processing unit operating to compute the following:
      a time-domain histogram of random jitter derived from the set of characteristic data;
      a time-domain histogram of deterministic jitter derived from a plurality of the samples; and
      a measure of jitter based on a calculation resulting in a convolution of the time-domain histogram of deterministic jitter and the time-domain histogram of random jitter.

65. The apparatus of claim 64, wherein the signal analyzer comprises a spectrum analyzer based on superheterodyne technology, and wherein the set of characteristic data measured by the spectrum analyzer corresponds to a set of spectral-power data.

66. The apparatus of claim 65, wherein the at least one processing unit connected to the memory computes at least one jitter filter, and uses the at least one jitter filter to compute at least one of: the time-domain histogram of random jitter, and the time-domain histogram of deterministic jitter.

67. The apparatus of claim 64, wherein the signal analyzer comprises a phase-noise analyzer, and wherein the set of characteristic data measured by the phase-noise analyzer corresponds to a set of phase-noise data.

68. The apparatus of claim 67, wherein the at least one processing unit connected to the memory computes at least one jitter filter, and uses the at least one jitter filter to compute at least one of: the time-domain histogram of random jitter, and the time-domain histogram of deterministic jitter.

* * * * *